(12) United States Patent
Kim

(10) Patent No.: US 8,472,199 B2
(45) Date of Patent: Jun. 25, 2013

(54) SYSTEM INCLUDING A PLURALITY OF ENCAPSULATED SEMICONDUCTOR CHIPS

(75) Inventor: Jin-Ki Kim, Kanata (CA)

(73) Assignee: MOSAID Technologies Incorporated, Ottawa (CA)

( * ) Notice: Subject to any disclaimer, the term of this patent is extended or adjusted under 35 U.S.C. 154(b) by 546 days.

(21) Appl. No.: 12/367,056

(22) Filed: Feb. 6, 2009

(65) Prior Publication Data

US 2010/0118482 A1 May 13, 2010

Related U.S. Application Data

(60) Provisional application No. 61/114,154, filed on Nov. 13, 2008.

(51) Int. Cl.
*H05K 1/14* (2006.01)

(52) U.S. Cl.
USPC ........... 361/736; 361/737; 361/728; 361/715; 361/752; 361/760; 361/764; 257/679; 257/692; 257/787; 439/66; 439/76.1; 710/74; 710/300; 710/301; 710/313; 235/441; 235/380; 365/51

(58) Field of Classification Search
USPC ................. 361/736, 737, 728, 715, 752, 760, 361/764; 257/679, 692, 787; 439/66, 76.1; 710/74, 300, 301, 313; 235/441, 380; 365/51
See application file for complete search history.

(56) References Cited

U.S. PATENT DOCUMENTS

| | | | | |
|---|---|---|---|---|
| 4,942,453 A | * | 7/1990 | Ishida et al. | 257/692 |
| 5,099,309 A | | 3/1992 | Kryzaniwsky | |
| 5,280,193 A | * | 1/1994 | Lin et al. | 257/723 |
| 5,355,016 A | * | 10/1994 | Swirbel et al. | 257/659 |
| 5,436,203 A | * | 7/1995 | Lin | 29/841 |
| 5,637,916 A | * | 6/1997 | Joshi | 257/668 |
| 5,729,433 A | * | 3/1998 | Mok | 361/704 |
| 5,956,233 A | * | 9/1999 | Yew et al. | 361/760 |
| 6,040,622 A | * | 3/2000 | Wallace | 257/679 |
| 6,100,804 A | * | 8/2000 | Brady et al. | 340/572.7 |

(Continued)

FOREIGN PATENT DOCUMENTS

WO 2010/054478 5/2010

OTHER PUBLICATIONS

Wei, Koh, "Digital Memory Card Market and Technology", 2005 Conference on High Density Microsystems Design and Packaging and Component Failure Analysis, Jun. 27-29, 2005, p. 1-5.
Chip-on-Board (COB), www.siliconfareast.com, p. 1-3.
Diamond, Stephen L., "SyncLink: High-speed dARM for the future", IEEE Micro, Dec. 1996, p. 74-75.
"1G× 8 Bit/ 2G×8 Bit NAND Flash Memory", Samsung Electronics.
"IEEE Standard for High-Bandwidth Memory Interface Based on Scalable Coherent Interface (SCI) Signaling Technology (RamLink)", The Institute of Electrical and Electronics Engineers, Inc., 1996, pp. 1-91.
"COB—Packaged and Tested" Technology presentation of SWISSBIT, , Nov. 25, 2008, www.swissbit.com.

*Primary Examiner* — Xiaoliang Chen
(74) *Attorney, Agent, or Firm* — Daniel A. Hammond

(57) ABSTRACT

A solid state drive is disclosed. The solid state drive includes a circuit board having opposing first and second surfaces. A plurality of semiconductor chips are attached to the first surface of the circuit board of the solid state drive, and the plurality of semiconductor chips of the solid state drive include at least one memory chip that is at least substantially encapsulated in a resin. An in-line memory module-type form factor circuit board is also disclosed. The in-line memory module-type form factor circuit board has opposing first and second surfaces. A plurality of semiconductor chips are attached to the first surface of the in-line memory module-type form factor circuit board, and these semiconductor chips include at least one memory chip that is at least substantially encapsulated in a resin.

11 Claims, 15 Drawing Sheets

U.S. PATENT DOCUMENTS

| | | | |
|---|---|---|---|
| 6,376,769 B1* | 4/2002 | Chung | 174/524 |
| 6,492,726 B1* | 12/2002 | Quek et al. | 257/723 |
| 6,624,005 B1* | 9/2003 | DiCaprio et al. | 438/113 |
| 6,628,537 B1* | 9/2003 | Wallace et al. | 365/52 |
| 6,674,159 B1* | 1/2004 | Peterson et al. | 257/680 |
| 7,276,790 B2* | 10/2007 | Seng | 257/724 |
| 7,476,105 B2* | 1/2009 | Ni et al. | 439/66 |
| 7,479,039 B2* | 1/2009 | Ni et al. | 439/620.15 |
| 7,492,039 B2* | 2/2009 | Seng | 257/686 |
| 7,535,088 B2* | 5/2009 | Ni et al. | 257/679 |
| 7,576,990 B2* | 8/2009 | Ni et al. | 361/737 |
| 7,839,672 B1* | 11/2010 | Lee et al. | 365/163 |
| 7,885,123 B2* | 2/2011 | Rolandi | 365/185.32 |
| 7,957,173 B2 | 6/2011 | Kim | |
| 8,134,852 B2 | 3/2012 | Kim et al. | |
| 2001/0007372 A1* | 7/2001 | Akram et al. | 257/724 |
| 2001/0020546 A1* | 9/2001 | Eldridge et al. | 174/261 |
| 2001/0048591 A1* | 12/2001 | Fjelstad et al. | 361/767 |
| 2002/0061607 A1* | 5/2002 | Akram | 438/118 |
| 2002/0172024 A1* | 11/2002 | Hui et al. | 361/767 |
| 2002/0192859 A1* | 12/2002 | Akram | 438/106 |
| 2002/0195699 A1* | 12/2002 | Akram et al. | 257/687 |
| 2003/0002262 A1* | 1/2003 | Benisek et al. | 361/728 |
| 2003/0011059 A1* | 1/2003 | Akram | 257/678 |
| 2003/0131932 A1* | 7/2003 | Hoult et al. | 156/272.8 |
| 2003/0142571 A1* | 7/2003 | Kanda et al. | 365/225.7 |
| 2003/0189257 A1* | 10/2003 | Corisis et al. | 257/777 |
| 2003/0230801 A1* | 12/2003 | Jiang et al. | 257/723 |
| 2004/0015079 A1* | 1/2004 | Berger et al. | 600/437 |
| 2004/0017707 A1* | 1/2004 | Wallace et al. | 365/200 |
| 2004/0083285 A1* | 4/2004 | Nicolson | 709/224 |
| 2004/0089717 A1* | 5/2004 | Harari et al. | 235/441 |
| 2004/0148482 A1 | 7/2004 | Grundy et al. | |
| 2004/0153595 A1* | 8/2004 | Sukegawa et al. | 710/305 |
| 2004/0171191 A1* | 9/2004 | Connell et al. | 438/112 |
| 2004/0215863 A1* | 10/2004 | Cedar et al. | 710/301 |
| 2005/0059273 A1* | 3/2005 | Chiou et al. | 439/76.1 |
| 2005/0070138 A1* | 3/2005 | Chiou et al. | 439/76.1 |
| 2005/0085129 A1* | 4/2005 | Chiou et al. | 439/607 |
| 2005/0109841 A1* | 5/2005 | Ryan et al. | 235/380 |
| 2005/0156333 A1* | 7/2005 | Chiou et al. | 257/787 |
| 2005/0189646 A1* | 9/2005 | Akram et al. | 257/712 |
| 2005/0198424 A1* | 9/2005 | Harari et al. | 710/301 |
| 2006/0022323 A1* | 2/2006 | Swee Seng | 257/686 |
| 2006/0026324 A1* | 2/2006 | Cedar et al. | 710/301 |
| 2006/0062047 A1* | 3/2006 | Bhakta et al. | 365/185.09 |
| 2006/0076694 A1* | 4/2006 | Chen et al. | 257/787 |
| 2006/0162156 A1* | 7/2006 | Reed | 29/841 |
| 2006/0180912 A1* | 8/2006 | Michaels et al. | 257/686 |
| 2006/0184709 A1* | 8/2006 | Sukegawa et al. | 710/313 |
| 2006/0202319 A1* | 9/2006 | Swee Seng | 257/686 |
| 2007/0069372 A1* | 3/2007 | Akram et al. | 257/712 |
| 2007/0070611 A1* | 3/2007 | Koh | 361/764 |
| 2007/0076479 A1 | 4/2007 | Kim et al. | |
| 2007/0109833 A1 | 5/2007 | Pyeon et al. | |
| 2007/0130414 A1* | 6/2007 | Ni et al. | 711/103 |
| 2007/0143677 A1 | 6/2007 | Pyeon et al. | |
| 2007/0165457 A1* | 7/2007 | Kim | 365/185.11 |
| 2007/0206365 A1* | 9/2007 | Shiu et al. | 361/752 |
| 2007/0233903 A1 | 10/2007 | Pyeon | |
| 2007/0233917 A1 | 10/2007 | Pyeon et al. | |
| 2007/0234071 A1 | 10/2007 | Pyeon | |
| 2007/0247800 A1* | 10/2007 | Smith et al. | 361/683 |
| 2007/0261883 A1* | 11/2007 | Chan et al. | 174/259 |
| 2007/0290376 A1* | 12/2007 | Zhao et al. | 257/787 |
| 2008/0050859 A1* | 2/2008 | Wallace | 438/123 |
| 2008/0067248 A1* | 3/2008 | Hiew et al. | 235/441 |
| 2008/0082714 A1* | 4/2008 | Hinchey | 710/300 |
| 2008/0104291 A1* | 5/2008 | Hinchey | 710/74 |
| 2008/0147935 A1* | 6/2008 | Hinchey | 710/74 |
| 2008/0235939 A1* | 10/2008 | Hiew et al. | 29/831 |
| 2008/0266816 A1* | 10/2008 | Ni et al. | 361/737 |
| 2009/0161402 A1* | 6/2009 | Oh et al. | 365/51 |
| 2009/0165294 A1* | 7/2009 | Upadhyayula et al. | 29/825 |
| 2009/0172235 A1* | 7/2009 | Yan et al. | 710/302 |
| 2009/0217093 A1* | 8/2009 | Co | 714/30 |
| 2009/0217102 A1* | 8/2009 | Co | 714/42 |
| 2009/0321530 A1* | 12/2009 | Harari et al. | 235/492 |
| 2010/0067278 A1 | 3/2010 | Oh et al. | |
| 2010/0081237 A1* | 4/2010 | Wong et al. | 438/127 |
| 2010/0091536 A1 | 4/2010 | Kim | |
| 2010/0091538 A1 | 4/2010 | Kim et al. | |
| 2010/0115172 A1 | 5/2010 | Gillingham et al. | |
| 2010/0115214 A1 | 5/2010 | Pyeon | |
| 2010/0157715 A1 | 6/2010 | Pyeon | |
| 2010/0161877 A1 | 6/2010 | Pyeon | |
| 2011/0194365 A1 | 8/2011 | Kim et al. | |

* cited by examiner

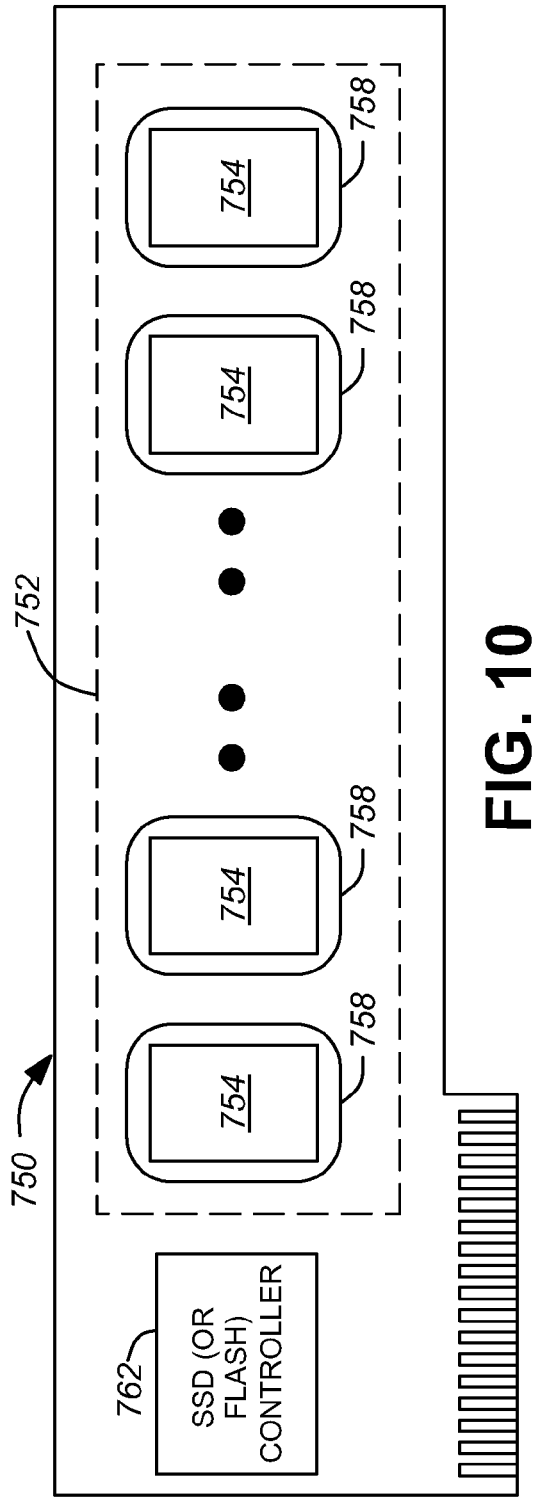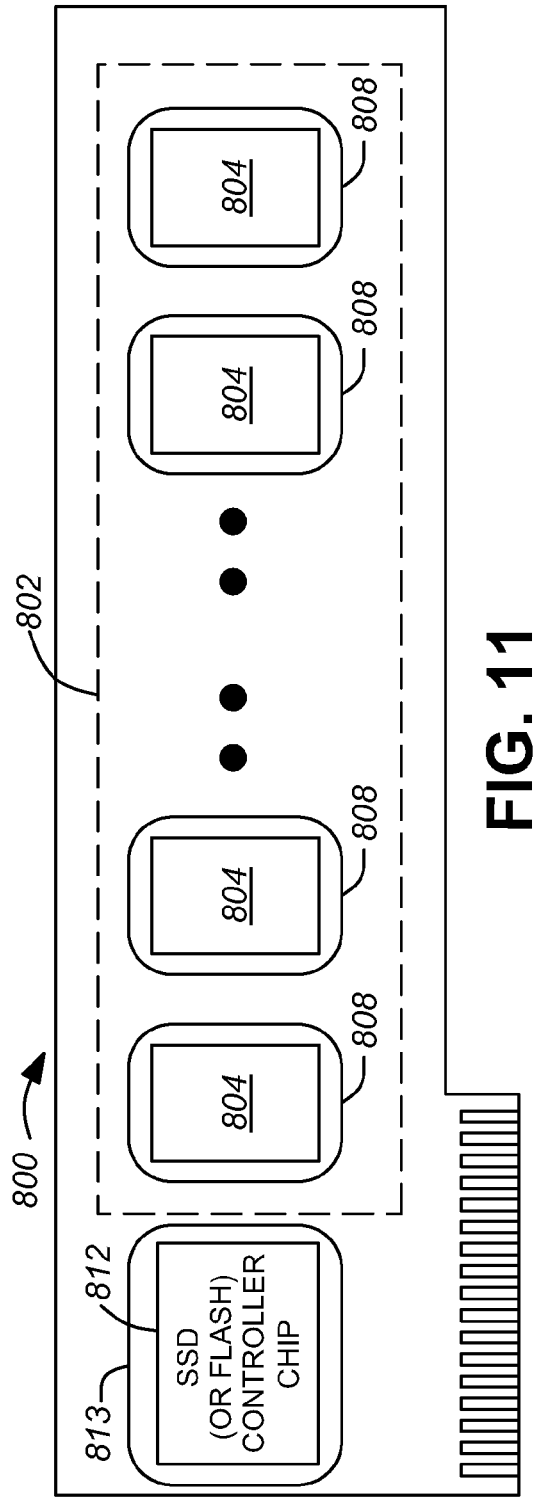

SYSTEM INCLUDING A PLURALITY OF ENCAPSULATED SEMICONDUCTOR CHIPS

CROSS REFERENCE TO RELATED APPLICATIONS

This application claims the benefit of priority of U.S. Provisional Patent Application Ser. No. 61/114,154 filed Nov. 13, 2008, which is incorporated herein by reference in its entirety.

BACKGROUND OF THE DISCLOSURE

Chip-On-board (COB) technology involves mounting (integrating) an Application Specific Integrated Circuit (ASIC), processor, memory semiconductor die, or other die/chip directly on a substrate (typically the printed circuit board) without the need for a packaged component. In addition to the die bonding, the process of integrating the die/chip may include the wire bonding, and possibly testing before or after encapsulation.

As will be appreciated by those skilled in the art, COB technology can help achieve high integration density. For example, eliminating the Thin Small-Outline Package (TSOP) or Fine-Pitch Ball Grid Array (FBGA) component package reduces the required substrate area and assembly weight. The saving in area can be as much as 20% in some cases. Using conventional Printed Circuit Boards (PCBs) and standard wire bonding technology, COB technology can yield very substantial weight and volume reduction. COB technology also reduces the number of interconnects between an active die and the substrate (i.e., the package pins), which improves the overall circuit speed, leads to higher clock rates, better electrical performance and improved signal quality, and increases the overall reliability of the module. Also, unlike other types of packaging, COB packaging is a Chip Scalable Packaging (CSP), meaning the packaging is not as limited by dimensioning and size standards as, for example, TSOP packaging. Additional benefits of COB packaging include better protection against reverse-engineering and, in some instances, elimination of soldering associated with conventional packaging.

Those skilled in the art will appreciate that, in connection with various COB processes, a coating of an epoxy encapsulent (or glob top) is applied for hermetically sealing and protecting the die and the wire bonded interconnections. The glob top also acts like a heat spreader between dies, improves heat emission, adds low Coefficients of Thermal Expansion (CTEs), and provides a hermetically sealed module assembly. The die may be glued directly to the PCB, and therefore increased heat dissipation from the die through the PCB is provided for.

Because COB technology is less pervasive in semiconductor manufacturing as compared to other conventional technologies, there exist gaps in research and development efforts with respect to systems that derive benefit from COB technology. Accordingly, there is a need for improved systems that are characterized by COB technology.

SUMMARY

It is an object of the invention to provide an improved system that includes at least one encapsulated memory chip.

According to one aspect of the invention, there is provided a solid state drive that includes a circuit board having opposing first and second surfaces. A plurality of semiconductor chips are attached to the first surface. The plurality of semiconductor chips include at least one memory chip that is at least substantially encapsulated in a resin. A controller is in communication with at least a number of the plurality of semiconductor chips. The number of semiconductor chips includes the at least one memory chip. The controller includes an interface that receives, from a computer system, signals for processing within the solid state drive.

According to another aspect of the invention, there is provided an apparatus that includes an in-line memory module-type form factor circuit board having opposing first and second surfaces. A plurality of semiconductor chips are attached to the first surface. The plurality of semiconductor chips includes at least one memory chip that is at least substantially encapsulated in a resin. A controller is in communication with the at least one memory chip. The controller includes an interface that receives signals comprising commands and data that effect operations within the at least one memory chip.

Thus, an improved solid state drive and other storage apparatuses have been provided.

BRIEF DESCRIPTION OF THE DRAWINGS

Reference will now be made, by way of example, to the accompanying drawings:

FIG. 10 is a diagram of a PCB in accordance with another example embodiment, the illustrated PCB having an in-line memory module-type form factor;

FIG. 11 is a diagram of a PCB in accordance with another example embodiment, the illustrated PCB having an in-line memory module-type form factor;

Similar or the same reference numerals may have been used in different figures to denote similar example features illustrated in the drawings.

DETAILED DESCRIPTION OF EXAMPLE EMBODIMENTS

Mass data storage systems in accordance with embodiments of the present invention can be incorporated into numerous types of computing devices, including desktop computers, laptops, netbooks, tablet PCs, servers (including web servers and mainframes) and mobile electronic communication devices, to name a few non-limiting possibilities.

Figure 1:
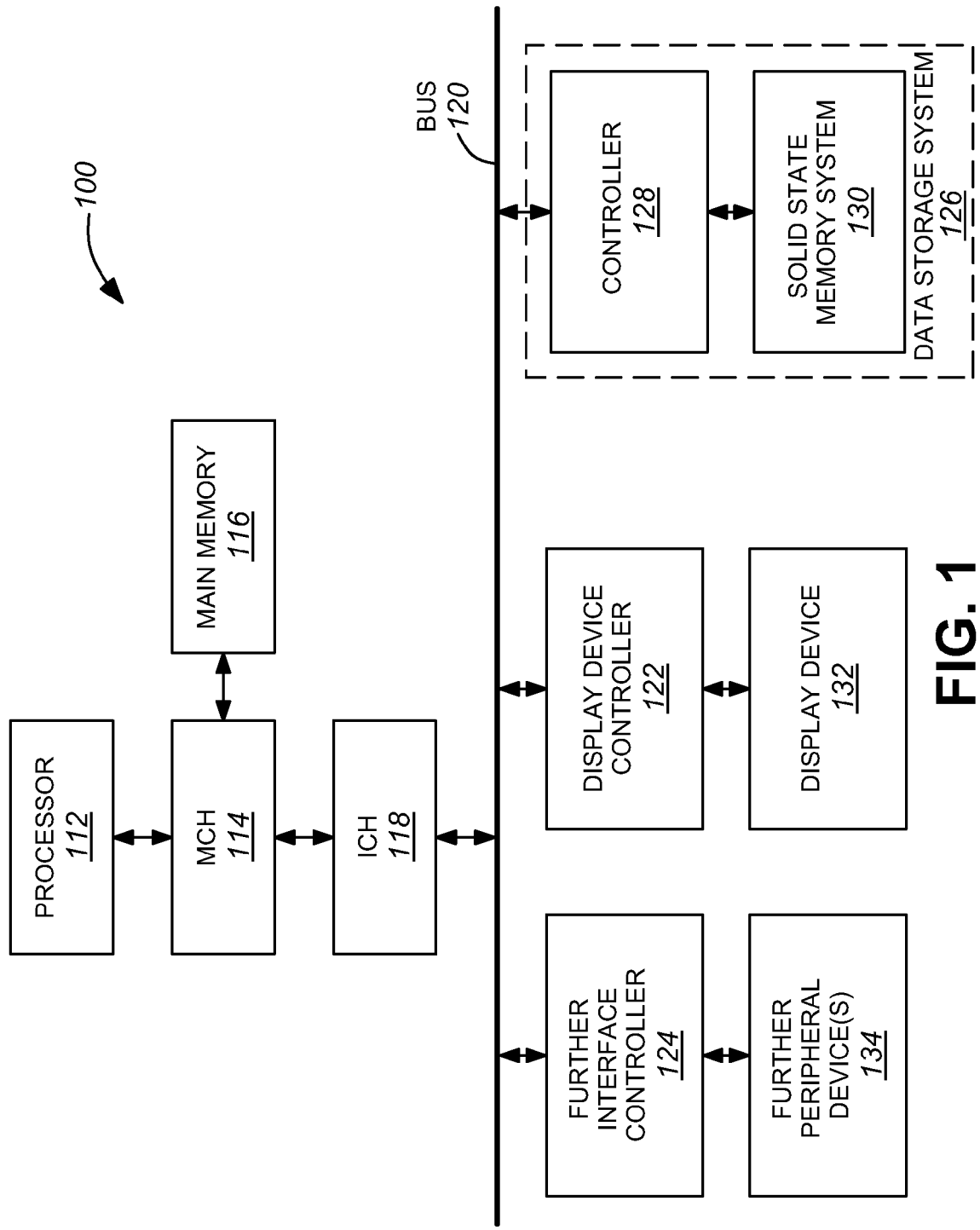
FIG. 1 is a diagram of an example computing device.

Reference is made to FIG. 1, which shows a computing device 100 such as, for example, a desktop computer, a laptop, a netbook, a tablet PC, a server (for instance, a web server or a mainframe), a mobile electronic communication device, etc. The device 100 includes a processor 112 that processes data signals. The processor 112 may be a Complex Instruction Set Computer (CISC) microprocessor, a Reduced Instruction Set Computing (RISC) microprocessor, a Very Long Instruction Word (VLIW) microprocessor, a processor implementing a combination of instruction sets, or other processor device. The processor 112 can be a single-core or multi-core processor. Also, not excluded is the possibility of there being multiple processors, similar to the processor 112, in the computing device 100.

The processor 112 is electrically connected to a Memory Controller Hub (MCH) 114, which interfaces to a main memory 116. The main memory 116 may be a Dynamic Random Access Memory (DRAM) device, a Synchronous Dynamic Random Access Memory (SDRAM) device, or other high speed volatile memory device. The main memory 116 may store instructions and code that are executable by the processor 112.

The MCH 114 also interfaces to an I/O Controller Hub (ICH) 118, which is electrically connected to a bus 120 that transmits data signals between the I/O Controller Hub (ICH) 118 and other components electrically connected to the bus 120. The bus 120 may be a single bus or a combination of multiple buses. As an example, the bus 120 may comprise a Peripheral Component Interconnect (PCI) bus, a PCI-Express bus, a Serial ATA bus, a Personal Computer Memory Card International Association (PCMCIA) bus, other buses or combinations thereof.

The bus 120 provides communication links among components in the computing device 100. Specifically, a display device controller 122 is electrically connected to the bus 120. The display device controller 122 permits use of a display device 132 and acts as an interface between the display device 132 (or a frame buffer thereof) and a remainder of the computing device 100. The display device controller 122 may be a Monochrome Display Adapter (MDA) card, a Color Graphics Adapter (CGA) card, an Enhanced Graphics Adapter (EGA) card, an Extended Graphics Array (XGA) card or other display device controller. The display device 132 may be integrated to the computing device 100 but it may also be an external device such as, for example, a television set, a computer monitor, a flat-panel display or other suitable display device coupled to the computing device 100 via a port or cable. The display device 132 receives data signals from the processor 112 through the display device controller 122 and converts the data signals into a visual output presented to the user of the computing device 100.

In addition, a further interface controller 124 is electrically connected to the bus 120. The further interface controller 124 is electrically connected to one or more further peripheral device(s) 134 such as, for example, a keyboard, mouse, network device or audio device.

In addition, a data storage system 126 is electrically connected to the bus 120. The data storage system 126 comprises a controller 128 (for example, an SSD controller) and a solid state memory system 130 (example embodiments of which will be subsequently described). The data storage system 126 may store large quantities of data that may be accessed by the processor 112.

Figure 2:
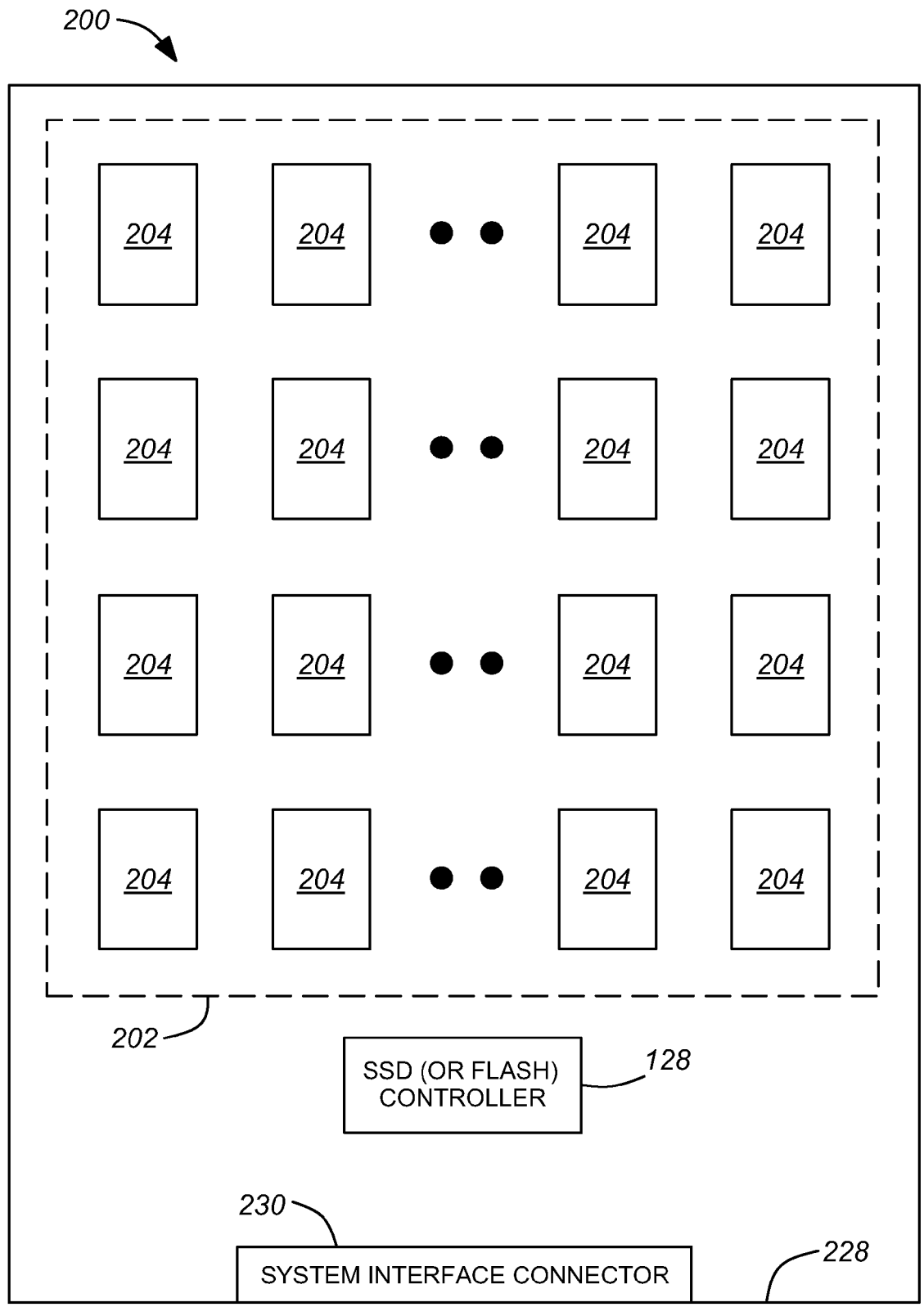
FIG. 2 is a diagram of an example PCB for a Solid State Drive (SSD)

Referring now to FIG. 2, illustrated in diagrammatic form is a PCB 200 for a conventional example of the data storage system 126. Now in connection with Hard Disk Drives (HDDs), which are the predecessor of SSDs, these are known to be manufactured in accordance with any of a limited number of form factors (i.e. physical dimensions). The 1.8", 2.5" and 3.5" form factors are example standards. Also, height is not necessarily the same between two HDDs of the same form factor. For instance, a so-called "half-height" HDD in compliance with the 3.5" form factor standard would be expected to have dimensions of 4.0" width, 5.75" depth, and 1.63" height; however a so-called "low-profile" HDD in compliance with the 3.5" form factor standard would be expected to have dimensions of 4.0" width, 5.75" depth, and 1.0" height.

Figure 3:
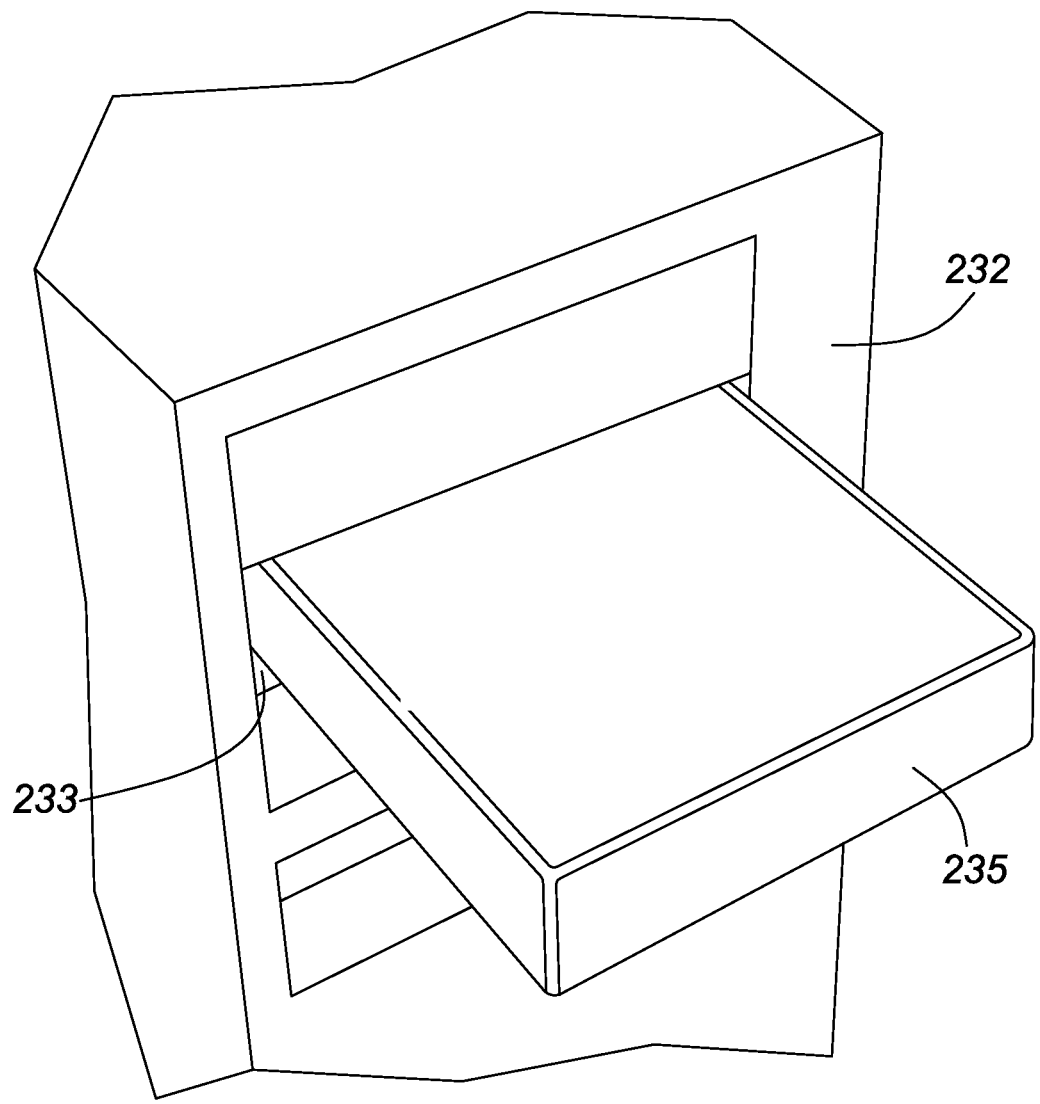
FIG. 3 is a diagram of a top front portion of an example desktop computer.

Interestingly, it is currently advantageous to continue to follow these existing form factor standards when manufacturing SSDs. A reason for this is that by complying with the existing form factor standards, drop-in SSD replacement of existing HDDs within computing devices is typically better facilitated. Shown in FIG. 3 is a desktop computer 232 which includes a bay 233. A rectangular shaped housing 235 is sized for insertion into the bay 233. Received within the rectangular shaped housing 235 would be a PCB such as, for example, the PCB 200 shown in FIG. 2. Also, although in the illustrated example a desktop computer is shown, those skilled in the art will appreciate that there exist other types of computing devices that include similar bays such as, for example, laptop computers.

As discussed above, it is currently advantageous to follow existing HDD form factor standards when manufacturing SSDs. It will be understood however that flash memory devices offer significant flexibility in terms of spatial arrangement, and therefore there may be a variety of different form factors that may possibly gain acceptance in flash storage systems in the not too distant future.

Still with reference to FIG. 2, the PCB 200 includes an area 202. It is at least primarily within the PCB area 202 that the solid state memory system 130 (FIG. 1) is found. The solid state memory system of the illustrated example takes the form of an implementation that includes a plurality of rows and columns of packaged chips 204. These packaged chips 204 include a plurality of pins that may be connected to electrical paths of the PCB 200 in a conventional manner such as, for example, by way of soldering. (For diagrammatic simplicity, above-referred to pins of the packaged chips 204 and electrical paths of the PCB 200 have not been illustrated.)

Attached at or proximate edge 228 of the PCB 200 is a system interface connector 230. Signals that are originating or destined to other parts of the computing device incorporating the data storage system, and that are transmitted to or from the PCB 200 travel through the system interface connector 230. The system interface connector 230 may be connected to, for example, one end of a ribbon cable, another end of which may in turn be connected to the bus 120 shown in FIG. 1.

Also shown on the PCB 200 is the SSD controller 128. Although the SSD controller 128 that is shown in FIG. 2 is a single monolithic chip, in alternative examples the SSD controller 128 may comprise multiple chips. The SSD controller 128 in accordance with some examples is shown in more detail in the diagram of FIG. 4.

Figure 4:
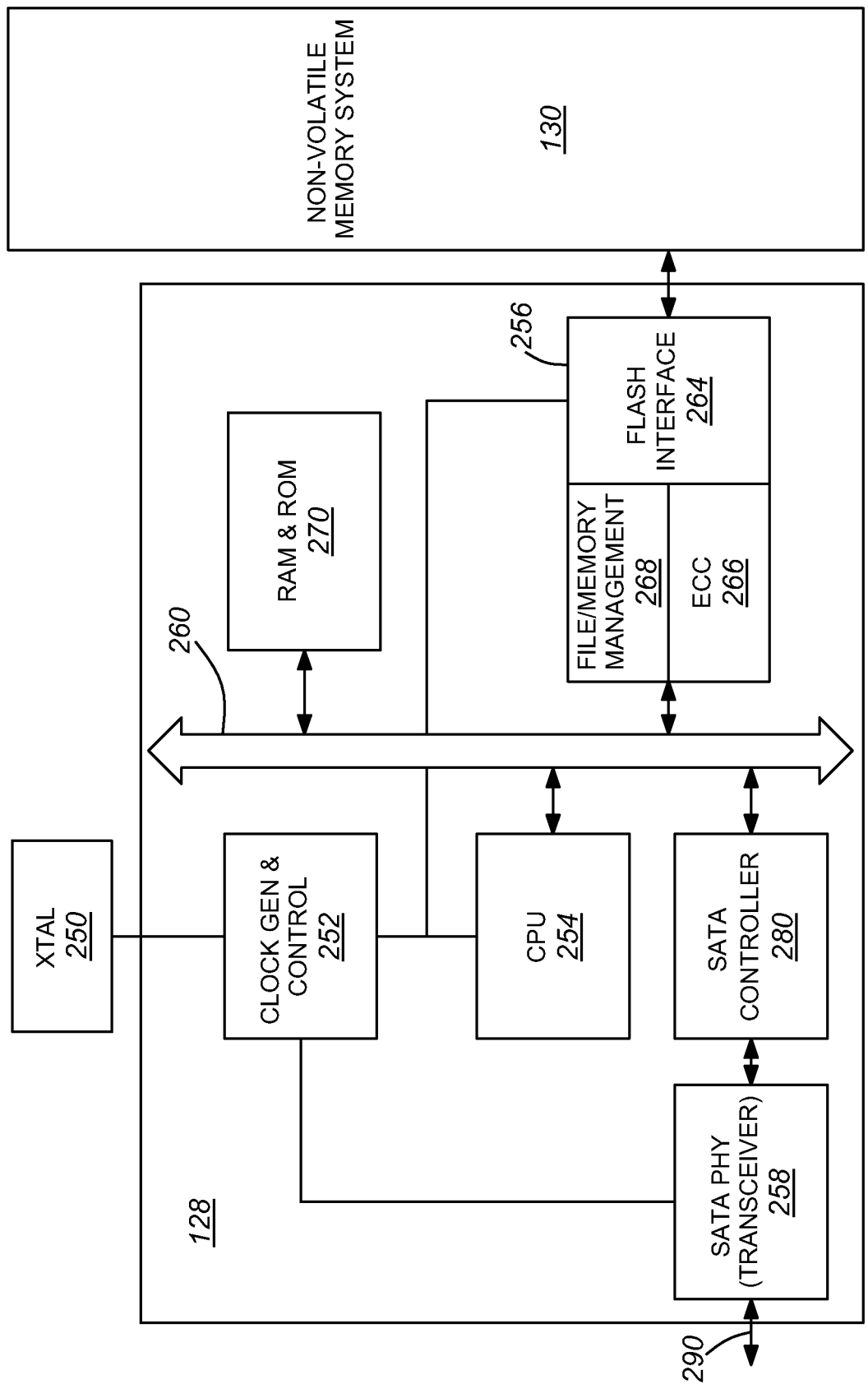
FIG. 4 is a diagram providing further detail of the controller shown in FIG. 2.

As shown in FIG. 4, the SSD controller 128 is provided a base clock signal from a crystal (Xtal) 250. The crystal 250 is connected to a clock generator and control component 252. The clock generator and control component 252 provides various clock signals to a Central Process Unit (CPU) 254, a control module 256, and a physical layer transceiver 258 (Serial ATA PHY in the illustrated example). The CPU 254 communicates with other subsystems by a common bus 260. The control module 256 includes a physical flash interface 264, an Error Correcting Code (ECC) component 266, and a file and memory management component 268. Flash devices within the solid state memory system 130 are accessed through the physical flash interface 264. Accessed data from these flash devices are checked and corrected by the ECC component 266. The file and memory management component 268 provides logical-to-physical address translation, wear-leveling algorithm, etc.

Also shown within the illustrated SSD controller 128 are Random Access Memory and Read Only Memory 270 (RAM & ROM 270). The RAM is used as buffer memory and the ROM stores executable codes (i.e. firmware). In some examples, the RAM & ROM 270 may be integral to the SSD controller 128. In alternative examples, the RAM & ROM 270 may be separate component(s). For instance, the SSD controller 128 might be implemented as a System-on-Chip (SoC) but with the RAM & ROM 270 as separate chip(s).

Finally, there is additionally shown a SATA controller 280. The SATA controller 280 controls operation of the SATA transceiver in a manner well known to those skilled in the art. Also, an interface 290 is provided for connectivity to other parts of the computing device incorporating the data storage system. Although the interface 290 may be a SATA interface, those skilled in the art will be aware of other suitable alternative interface such as, for example, PATA interface, eSATA interface, USB interface, SCSI interface, PCIe interface, Serial Attached SCSI (SAS) interface.

Figure 5:
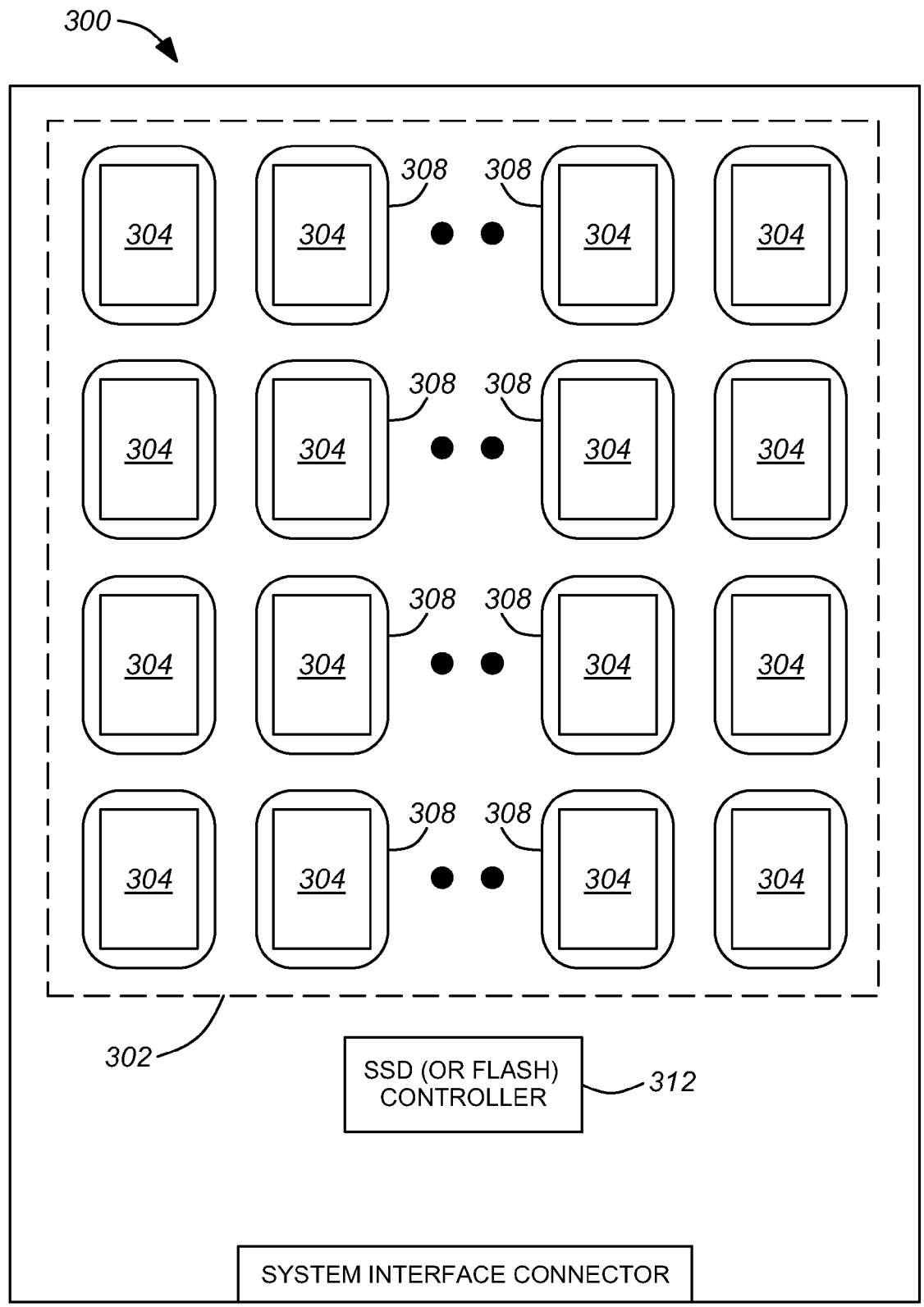
FIG. 5 is a diagram of a PCB for an SSD in accordance with an example embodiment.

Referring now to FIG. 5, illustrated in diagrammatic form is a PCB 300 in accordance with an example embodiment. Within an area 302 of the PCB 300, there exists a plurality of rows and columns of memory chips 304. As contrasted with the PCB area 202 of the PCB 200 shown in FIG. 2, each individual memory chip 304 within the PCB area 302 is not within a conventional package, but is rather within a corresponding (respective) encapsulation 308, and hence memory chips are provided on the PCB 300 in accordance with COB technology. In the illustrated example embodiment a controller 312 is outside of the area 302 and is not encapsulated; however alternatively the controller 312 may be encapsulated as well. In summary, a data storage system in accordance with the example embodiment of FIG. 5 is similar to a data storage system in accordance with the example of FIG. 2, with a primary difference being that the former inventively incorporates COB technology, whereas the latter does not.

Figure 6:
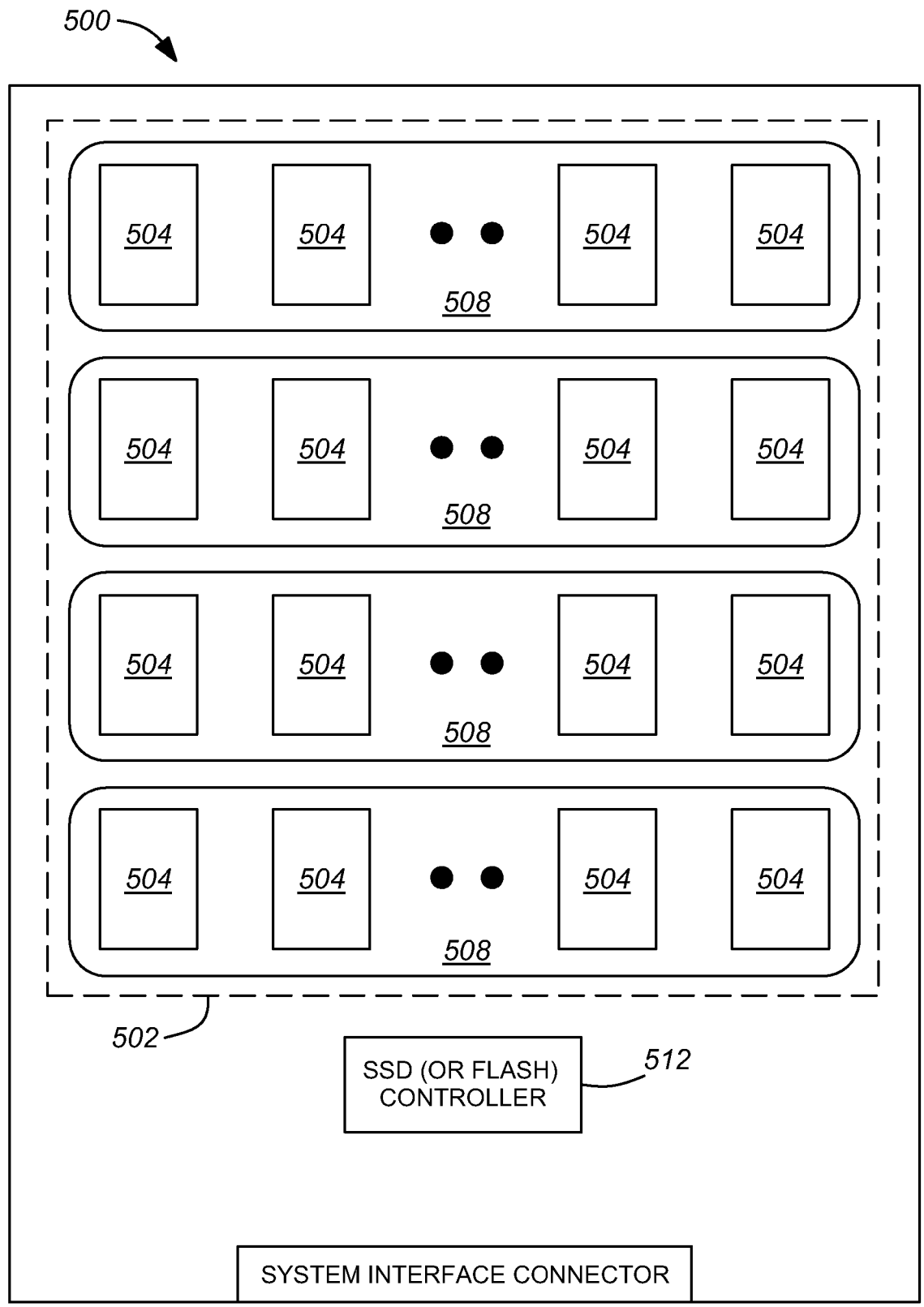
FIG. 6 is a diagram of a PCB for an SSD in accordance with another example embodiment.

Referring now to FIG. 6, illustrated in diagrammatic form is a PCB 500 in accordance with an example embodiment. Within an area 502 of the PCB 500, there exists a plurality of rows and columns of memory chips 504. Also, each row is within a corresponding (respective) encapsulation 508. A controller 512 is outside of the area 502 and is not encapsulated. In summary, the example embodiment of FIG. 6 is similar to the example embodiment of FIG. 5, with a primary difference being that in the former each row is within the respective encapsulation 508 of the row, whereas in the later each of the memory chips 304 is within the respective encapsulation of the individual chip.

Figure 7:
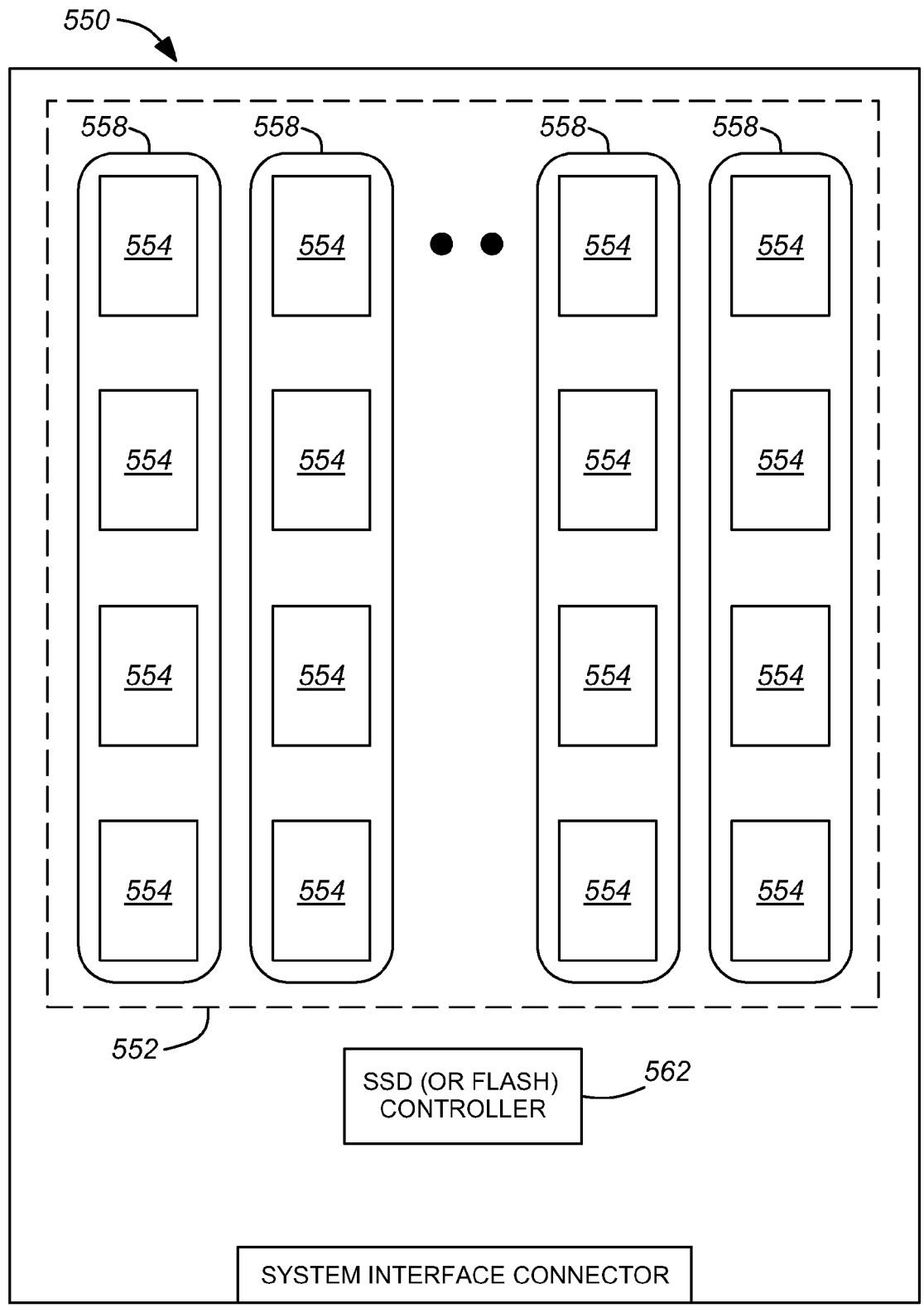
FIG. 7 is a diagram of a PCB for an SSD in accordance with another example embodiment.

Referring now to FIG. 7, illustrated in diagrammatic form is a PCB 550 in accordance with another example embodiment. Within an area 552 of the PCB 550, there exists a plurality of rows and columns of memory chips 554. Also, each column is within a corresponding (respective) encapsulation 558. A controller 562 is outside of the area 552 and is not encapsulated. Thus, the example embodiment of FIG. 7 is similar to the example embodiment of FIG. 6, with a primary difference being that in the former each column is within the respective encapsulation 558 of the column, whereas in the later each row is within the respective encapsulation of the row.

Figure 8:
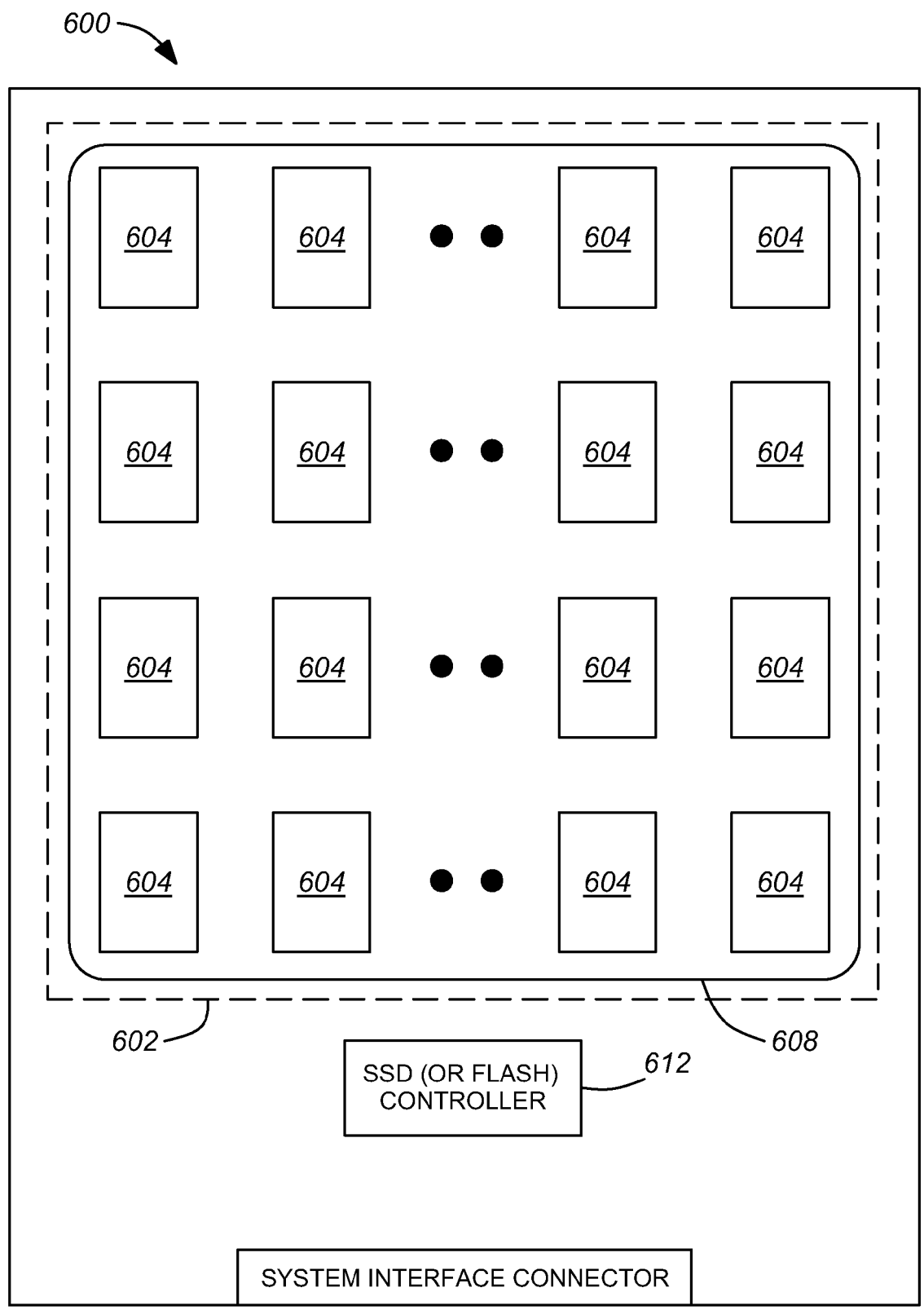
FIG. 8 is a diagram of a PCB for an SSD in accordance with another example embodiment.

Referring now to FIG. 8, illustrated in diagrammatic form is a PCB 600 in accordance with another example embodiment. Within an area 602 of the PCB 600, there exists a plurality of rows and columns of memory chips 604. Also, all rows and columns are within a single encapsulation 608. A controller 612 is outside of the area 602 and is not encapsulated. In summary, the example embodiment of FIG. 8 is similar to the example embodiment of FIG. 7, with a primary difference being that in the former all rows and columns are within the single encapsulation 608, whereas in the later each column is within the respective encapsulation of the column.

Figure 9:
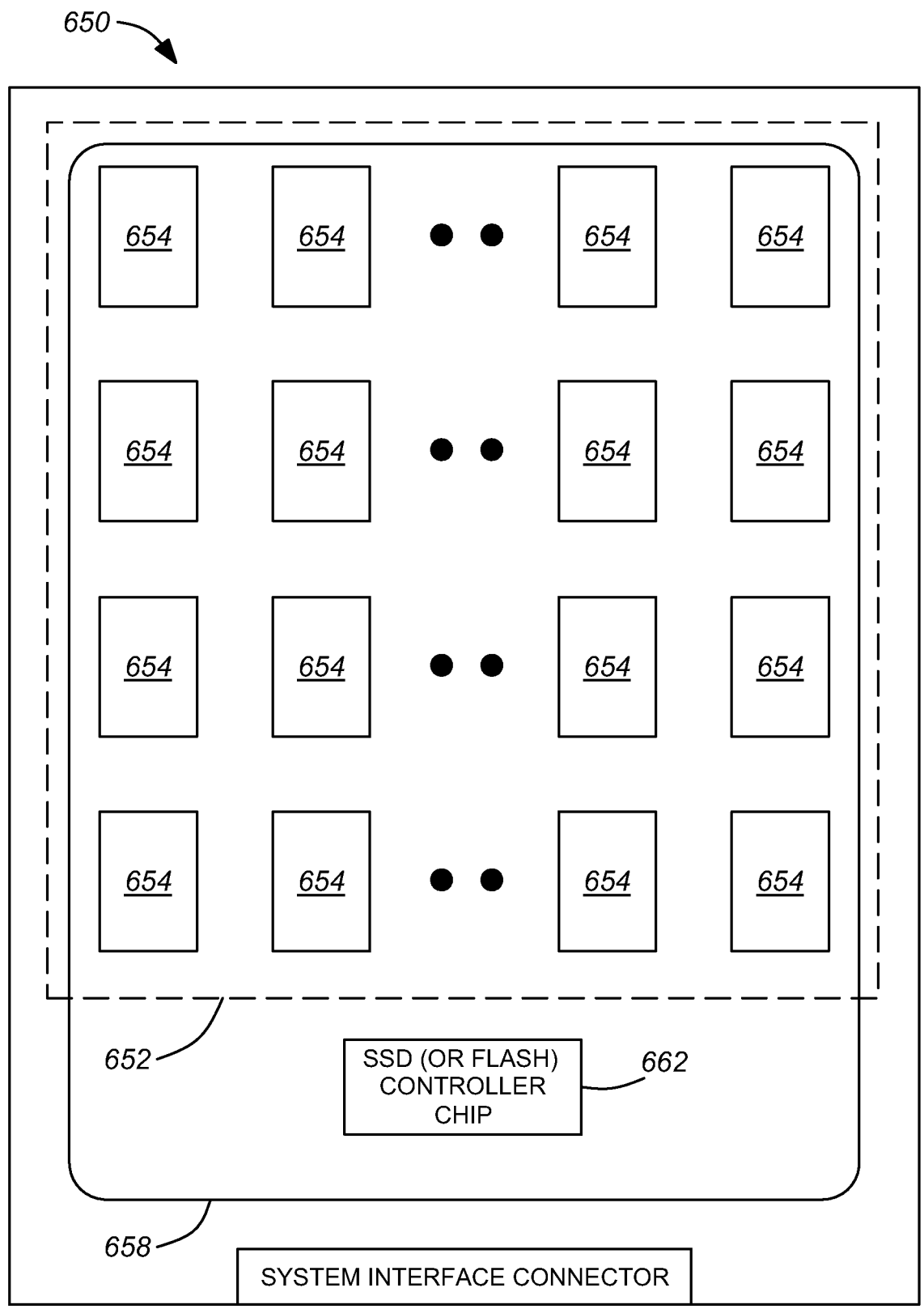
FIG. 9 is a diagram of a PCB for an SSD in accordance with another example embodiment.

Referring now to FIG. 9, illustrated in diagrammatic form is a PCB 650 in accordance with another example embodiment. Within an area 652 of the PCB 650, there exists a plurality of rows and columns of memory chips 654. Also, all rows and columns are within a single encapsulation 658. A controller 662 is outside of the area 652 and is encapsulated within the encapsulation 658. Thus, the example embodiment of FIG. 9 is similar to the example embodiment of FIG. 8, with a primary difference being that in the former the controller is within the encapsulation, whereas in the latter the controller is not encapsulated but may instead be within, for instance, conventional chip packaging.

Referring now to FIG. 10, illustrated is a PCB 750 in accordance with another example embodiment, and the PCB 750 having an in-line memory module-type form factor. Within an area 752 of the PCB 750, there exists a row of memory chips 754, with each individual memory chip encapsulated in a corresponding (respective) encapsulation 758. A controller 762 outside of the area 752 is not encapsulated.

Referring now to FIG. 11, illustrated is a PCB 800 in accordance with another example embodiment, and the PCB 800 having an in-line memory module-type form factor. Within an area 802 of the PCB 800, there exists a row of memory chips 804, with each individual memory chip encapsulated in a corresponding (respective) encapsulation 808. A controller 812 is outside of the area 802 and is encapsulated in a respective encapsulation 813.

Figure 12:
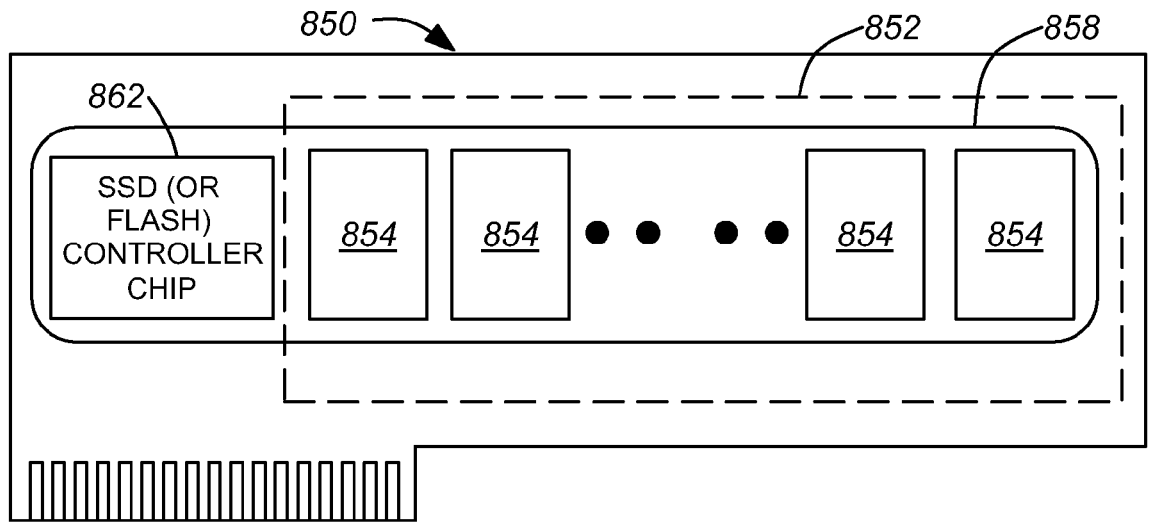
FIG. 12 is a diagram of a PCB in accordance with another example embodiment, the illustrated PCB having an in-line memory module-type form factor.

Referring now to FIG. 12, illustrated is a PCB 850 in accordance with another example embodiment, and the PCB 850 having an in-line memory module-type form factor. Within an area 852 of the PCB 850, there exists a row of memory chips 854, with the entire row encapsulated within an encapsulation 858. A controller 862 outside of the area 852 is encapsulated within the encapsulation 858.

Figure 13:
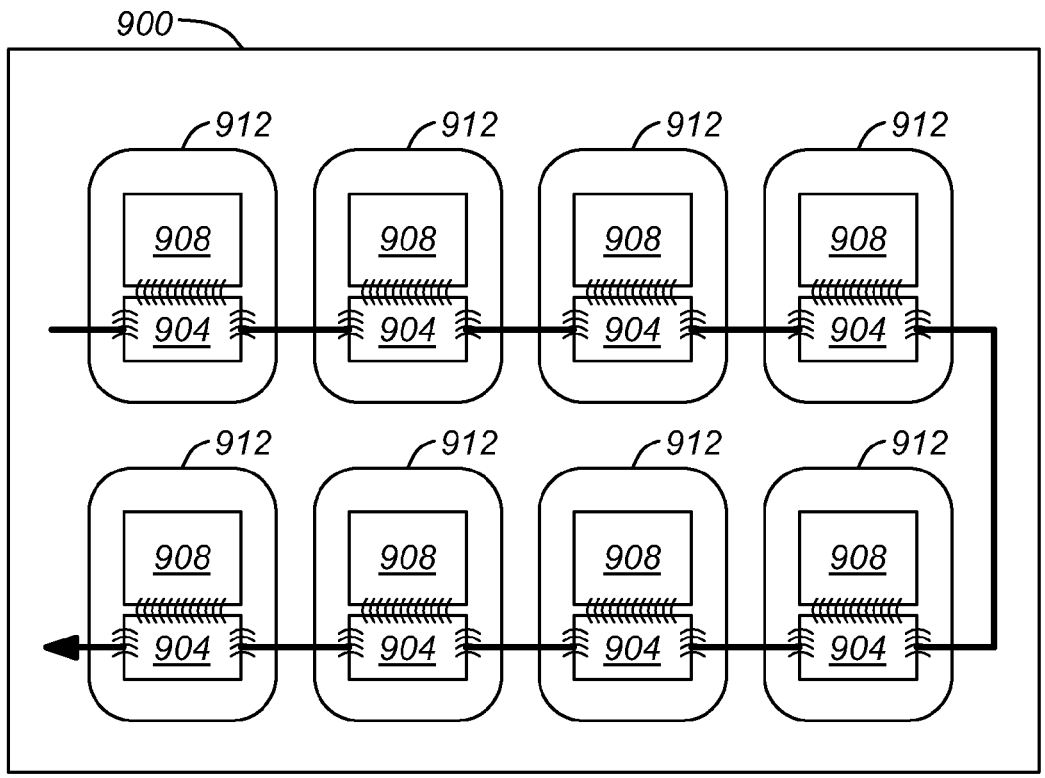
FIG. 13 is a diagram of a PCB area in accordance with an example embodiment, the illustrated area being, in some examples, a part of a larger area of a PCB for an SSD.

Referring now to FIG. 13, illustrated is a PCB area 900 in accordance with an example embodiment. It should be noted that, in some examples, the illustrated PCB area 900 can correspond to a flash chip area similar to any of those shown in dashed lines in any of FIGS. 5 through 9; however it will be understood that the presently described example embodiment is not limited to only PCBs that are employed in SSDs. Within the PCB area 900, there is a plurality of series-connected interface chips 904, such that the illustrated system may be characterized as having a ring-type architecture. In connection with data transmissions occurring within some examples of the illustrated system, data may be transmitted from one of the interface chips 904 to a neighboring interface chip in a manner as described in commonly owned U.S. patent application Ser. No. 12/033,577 entitled "SYSTEM HAVING ONE OR MORE MEMORY DEVICES", the entire contents of which are incorporated herein by reference. In alternative examples of the illustrated system, data transmission between different ring stages may be realized in some other suitable manner.

Still with reference to FIG. 13, each of the interface chips 904 is electrically connected to a corresponding (respective) NAND flash chip 908. Also, it will be understood that at each stage (segment) of the illustrated ring there is a NAND flash chip-interface chip pair. Each NAND flash chip-interface chip pair is within a corresponding (respective) encapsulation 912. In connection with data transmissions occurring between chips of a chip pair, data may be transmitted from the NAND flash chip 908 to the interface chip 904 (or vice-versa) in the typical manner associated with asynchronous NAND. Alternatively, in other examples these data transmissions will occur in some other manner such as, for instance, synchronously as described in "Open NAND Flash Interface Specification", Revision 2.0, Feb. 27, 2008 (ONFi 2.0 spec.). Those skilled in the art will appreciate that the ONFi 2.0 spec. is compatible with a so-called "multi-drop bus" topology. In such a topology, it is typical for all signal paths, such as, for example, those for input, output and control signals, but with the exception of chip enable signals, to be provided by a common bus. The controller can access each memory device via the common bus, and (assuming only one channel) only a single memory device can be selected at one time by assertion of a chip enable signal on the device.

Figure 14:
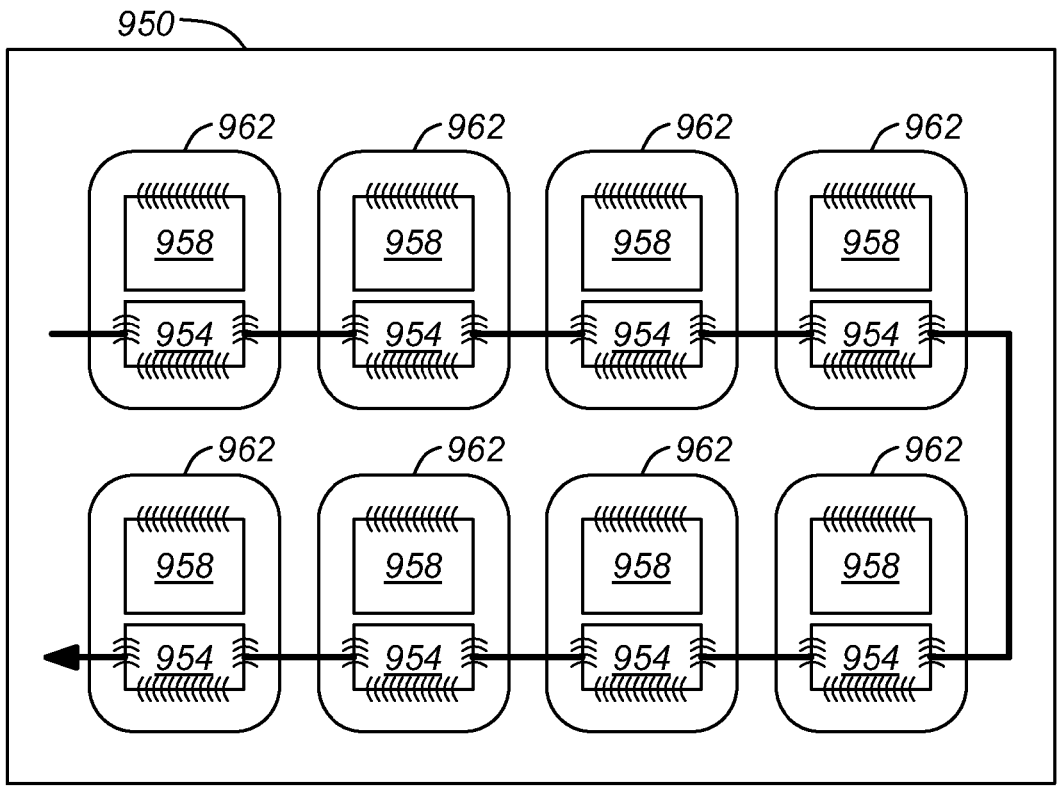
FIG. 14 is a diagram of a PCB area in accordance with another example embodiment, the illustrated area being, in some examples, a part of a larger area of a PCB for an SSD.

Referring now to FIG. 14, illustrated is a PCB area 950 in accordance with another example embodiment. It should be noted that, in some examples, the illustrated PCB area 950 can correspond to a flash chip area similar to any of those shown in dashed lines in any of FIGS. 5 through 9; however it will be understood that the presently described example embodiment is not limited to only PCBs that are employed in SSDs. Within the PCB area 950, there is a plurality of series-connected interface chips 954, such that the illustrated system may be characterized as having a ring-type architecture. In connection with data transmissions occurring within some examples of the illustrated system, data may be transmitted from one of the interface chips 954 to a neighboring interface chip in a manner as described in U.S. patent application Ser. No. 12/033,577 entitled "SYSTEM HAVING ONE OR MORE MEMORY DEVICES". In alternative examples of the illustrated system, data transmission between different ring stages may be realized in some other suitable manner.

Still with reference to FIG. 14, each of the interface chips 954 communicates with a corresponding (respective) NAND flash chip 958 via electrical paths provided by the PCB. Also, it will be understood that at each stage (segment) of the illustrated ring there is a NAND flash chip-interface chip pair. Each NAND flash chip-interface chip pair is encapsulated within a corresponding (respective) encapsulation 962. In connection with data transmissions occurring between chips of a chip pair, data may be transmitted from the NAND flash chip 958 to the interface chip 954 (or vice-versa) in the typical manner associated with asynchronous NAND. Alternatively, in other examples these data transmissions will occur in some other manner such as, for instance, synchronously as described in the ONFi 2.0 spec.

Figure 15:
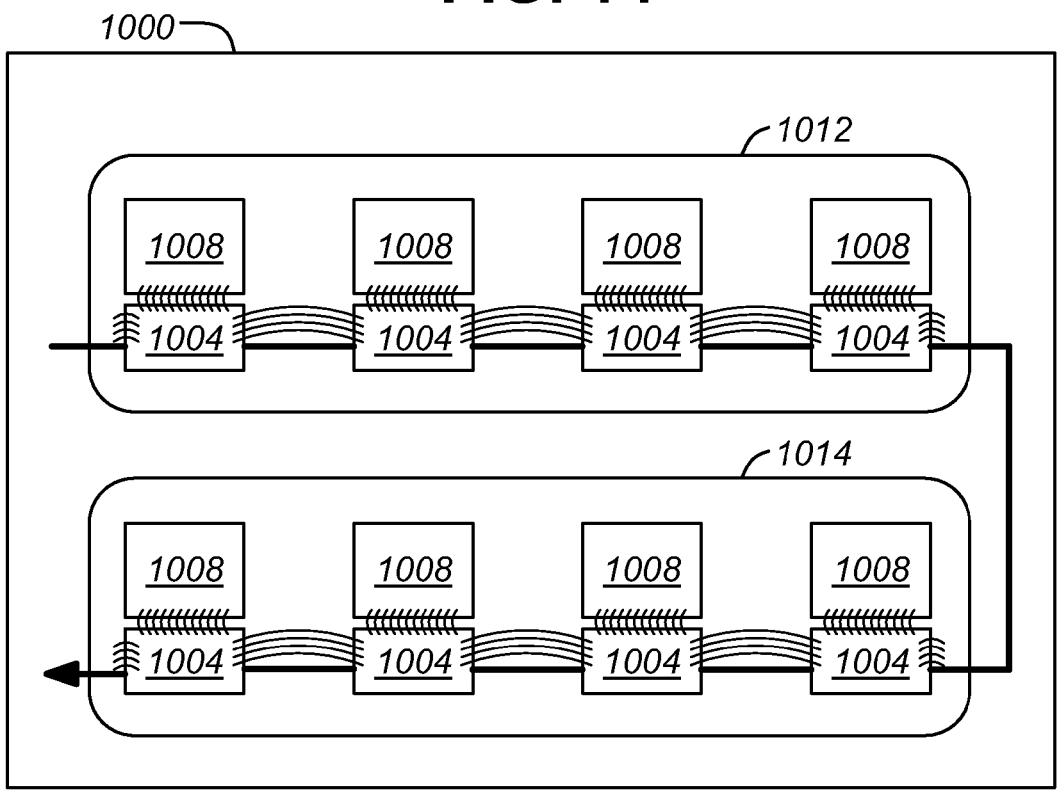
FIG. 15 is a diagram of a PCB area in accordance with another example embodiment, the illustrated area being, in some examples, a part of a larger area of a PCB for an SSD.

Referring now to FIG. 15, illustrated is a PCB area 1000 in accordance with another example embodiment. It should be noted that, in some examples, the illustrated PCB area 1000 can correspond to a flash chip area similar to any of those shown in dashed lines in any of FIGS. 5 through 9; however it will be understood that the presently described example embodiment is not limited to only PCBs that are employed in SSDs. Within the PCB area 1000, there is a plurality of series-connected interface chips 1004, such that the illustrated system may be characterized as having a ring-type architecture in which there are a plurality of stages. In connection with data transmissions occurring within some examples of the illustrated system, data may be transmitted from one of the interface chips 1004 to a neighboring interface chip in a manner as described in U.S. patent application Ser. No. 12/033,577 entitled "SYSTEM HAVING ONE OR MORE MEMORY DEVICES". In alternative examples of the illustrated system, data transmission between different ring stages may be realized in some other suitable manner.

Still with reference to FIG. 15, each of the interface chips 1004 is electrically connected to a corresponding (respective) NAND flash chip 1008. A first group of NAND flash chips 1008 and interface chips 1004 (in the illustrated example embodiment, four and four for a total of eight) are encapsulated within an encapsulation 1012. A second group of NAND flash chips 1008 and interface chips 1004 (in the illustrated example embodiment, four and four for a total of eight) are encapsulated within another encapsulation 1014. In the illustrated example embodiment therefore, half of the eight stages of the ring are within the encapsulation 1012, and the other half of the eight stages of the ring are within the encapsulation 1014. In connection with data transmissions occurring between chips belonging to the same ring stage, data may be transmitted from the NAND flash chip 1008 to the interface chip 1004 (or vice-versa) in the typical manner associated with asynchronous NAND. Alternatively, in other examples these data transmissions will occur in some other manner such as, for instance, synchronously as described in the ONFi 2.0 spec.

Figure 16:
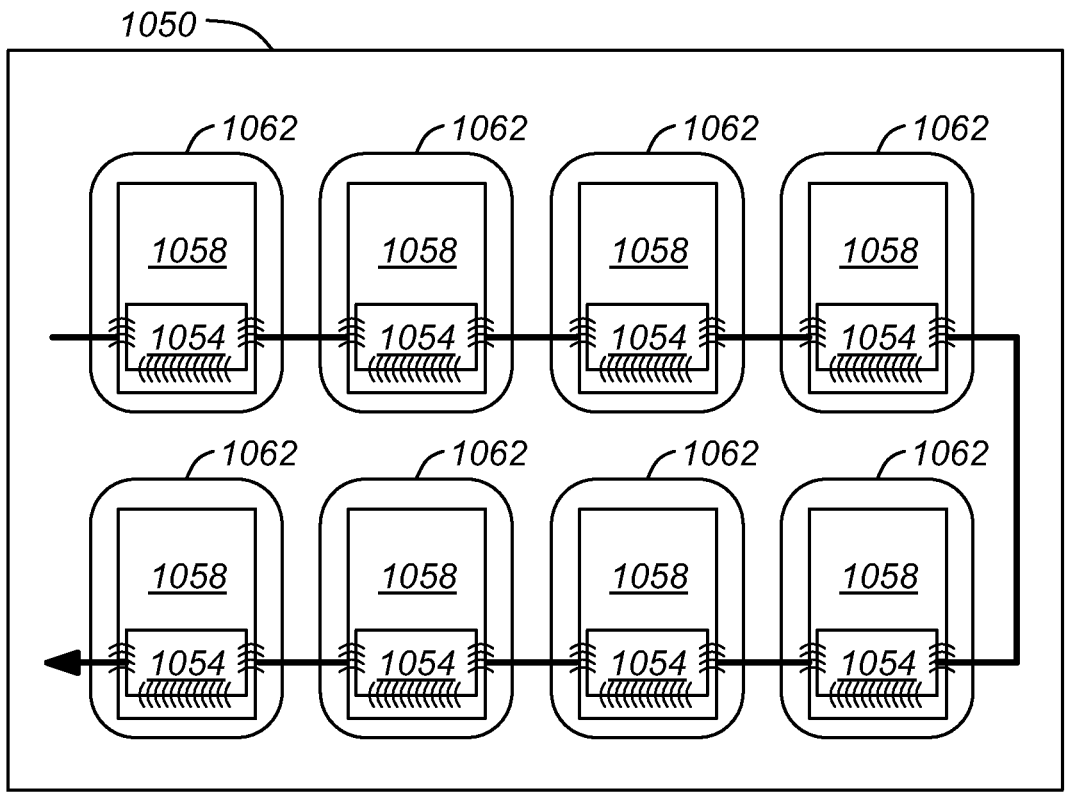
FIG. 16 is a diagram of a PCB area in accordance with another example embodiment, the illustrated area being, in some examples, a part of a larger area of a PCB for an SSD.

Referring now to FIG. 16, illustrated is a PCB area 1050 in accordance with another example embodiment. It should be noted that, in some examples, the illustrated PCB area 1050 can correspond to a flash chip area similar to any of those shown in dashed lines in any of FIGS. 5 through 9; however it will be understood that the presently described example embodiment is not limited to only PCBs that are employed in SSDs. Within the PCB area 1050, there is a plurality of series-connected interface chips 1054, such that the illustrated system may be characterized as having a ring-type architecture. In connection with data transmissions occurring within some examples of the illustrated system, data may be transmitted from one of the interface chips 1054 to a neighboring interface chip in a manner as described in U.S. patent application Ser. No. 12/033,577 entitled "SYSTEM HAVING ONE OR MORE MEMORY DEVICES". In alternative examples of the illustrated system, data transmission between different ring stages may be realized in some other suitable manner.

Still with reference to FIG. 16, each of the interface chips 1054 is electrically connected to a corresponding (respective) NAND flash chip 1058. Also, each of the interface chips 1054 is stacked on their corresponding NAND flash chip 1058.

Also, it will be understood that at each stage (segment) of the illustrated ring there is a NAND flash chip-interface chip pair (stack of two chips). Each NAND flash chip-interface chip pair is encapsulated within a corresponding (respective) encapsulation 1062. With respect to data transmissions occurring between chips belonging to the same ring stage (i.e. stack), data may be transmitted from the NAND flash chip 1058 to the interface chip 1054 (or vice-versa) in the typical manner associated with asynchronous NAND. Alternatively, in other examples these data transmissions will occur in some other manner such as, for instance, synchronously as described in the ONFi 2.0 spec.

Figure 17:
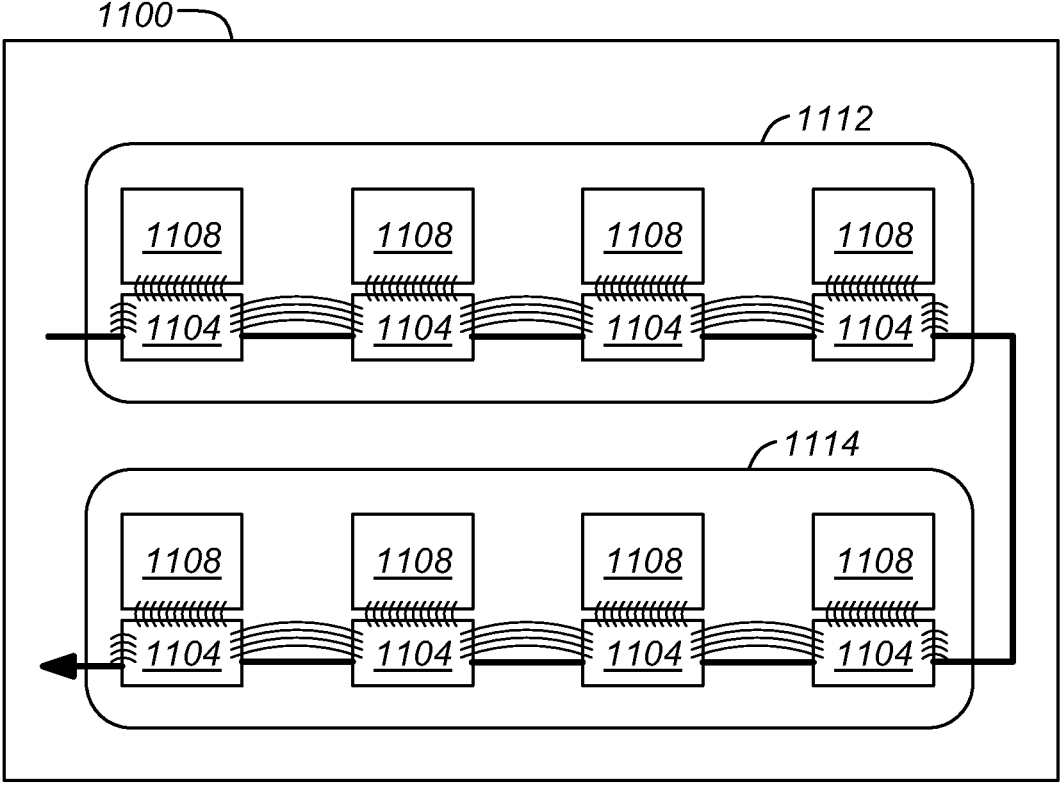
FIG. 17 is a diagram of a PCB area in accordance with another example embodiment, the illustrated area being, in some examples, a part of a larger area of a PCB for an SSD.

Referring now to FIG. 17, illustrated is a PCB area 1100 in accordance with another example embodiment. It should be noted that, in some examples, the illustrated PCB area 1100 can correspond to a flash chip area similar to any of those shown in dashed lines in any of FIGS. 5 through 9; however it will be understood that the presently described example embodiment is not limited to only PCBs that are employed in SSDs. Within the PCB area 1100, there is a plurality of series-connected interface chips 1104, such that the illustrated system may be characterized as having a ring-type architecture in which there are a plurality of stages. In connection with data transmissions occurring within some examples of the illustrated system, data may be transmitted from one of the interface chips 1104 to a neighboring interface chip in a manner as described in U.S. patent application Ser. No. 12/033,577 entitled "SYSTEM HAVING ONE OR MORE MEMORY DEVICES". In alternative examples of the illustrated system, data transmission between different ring stages may be realized in some other suitable manner.

Still with reference to FIG. 17, each of the interface chips 1104 is electrically connected to a corresponding (respective) NAND flash chip 1108. Also, each of the interface chips 1104 is stacked on their corresponding NAND flash chip 1108. A first group of NAND flash chips 1108 and interface chips 1104 (in the illustrated example embodiment, four and four for a total of eight) are encapsulated within an encapsulation 1112. A second group of NAND flash chips 1108 and interface chips 1104 (in the illustrated example embodiment, four and four for a total of eight) are encapsulated within another encapsulation 1114. In the illustrated example embodiment therefore, half of the eight stages of the ring are within the encapsulation 1112, and the other half of the eight stages of the ring are within the encapsulation 1114. In connection with data transmissions occurring between chips belonging to the same ring stage (i.e. stack), data may be transmitted from the NAND flash chip 1108 to the interface chip 1104 (or vice-versa) in the typical manner associated with asynchronous NAND. Alternatively, in other examples these data transmissions will occur in some other manner such as, for instance, synchronously as described in the ONFi 2.0 spec.

Figure 18:
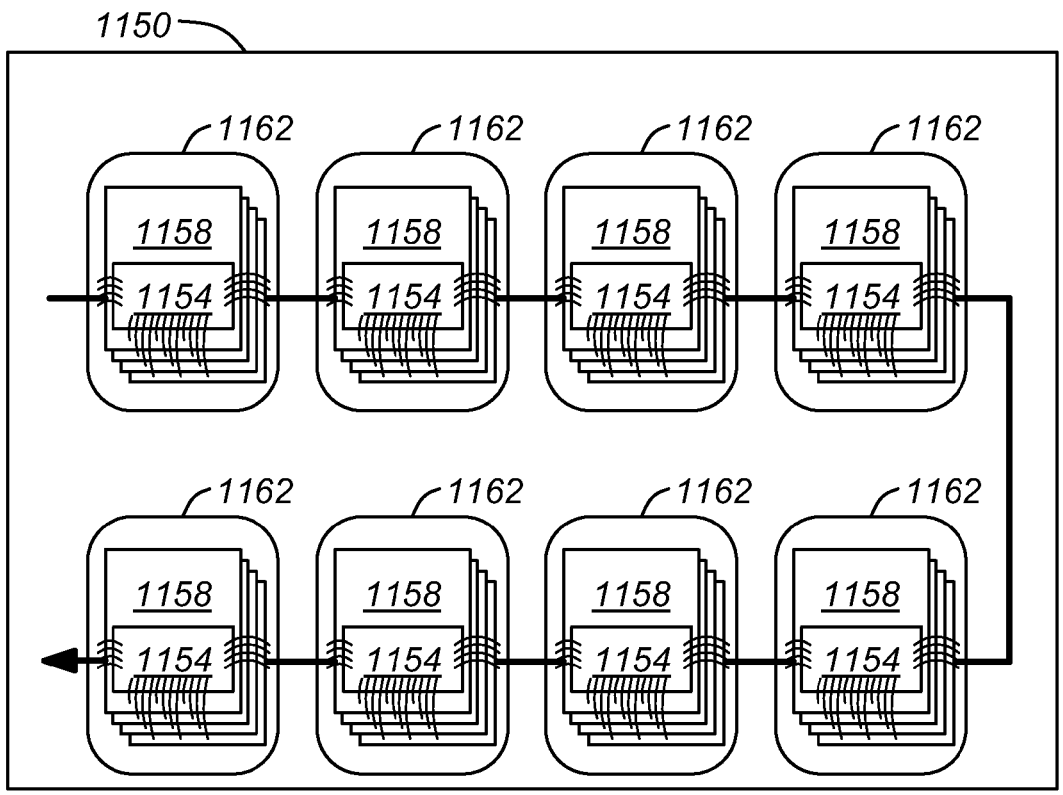
FIG. 18 is a diagram of a PCB area in accordance with another example embodiment, the illustrated area being, in some examples, a part of a larger area of a PCB for an SSD.

Referring now to FIG. 18, illustrated is a PCB area 1150 in accordance with another example embodiment. It should be noted that, in some examples, the illustrated PCB area 1150 can correspond to a flash chip area similar to any of those shown in dashed lines in any of FIGS. 5 through 9; however it will be understood that the presently described example embodiment is not limited to only PCBs that are employed in SSDs. Within the PCB area 1150, there is a plurality of series-connected interface chips 1154, such that the illustrated system may be characterized as having a ring-type architecture. In connection with data transmissions occurring within some examples of the illustrated system, data may be transmitted from one of the interface chips 1154 to a neighboring interface chip in a manner as described in U.S. patent application Ser. No. 12/033,577 entitled "SYSTEM HAVING ONE OR MORE MEMORY DEVICES". In alternative examples of the illustrated system, data transmission between different ring stages may be realized in some other suitable manner.

Still with reference to FIG. 18, each of the interface chips 1154 is electrically connected to each of a plurality (four in the illustrated example embodiment) of NAND flash chips 1158 in a stage. Also, each of the plurality of NAND flash chips 1158 in a stage are stacked one on top of each other, with the interface chip 1154 at the top of the stack. Eight stages are present in the illustrated ring (one stack per stage, each stack five chips in height). Each of the eight stacks is encapsulated within its own encapsulation 1162. In connection with data transmissions occurring between chips belonging to the same ring stage (i.e. stack), data may be transmitted from any one of the NAND flash chips 1158 to the interface chip 1154 (or vice-versa) in the typical manner associated with asynchronous NAND. Alternatively, in other examples these data transmissions will occur in some other manner such as, for instance, synchronously as described in the ONFi 2.0 spec.

Figure 19:
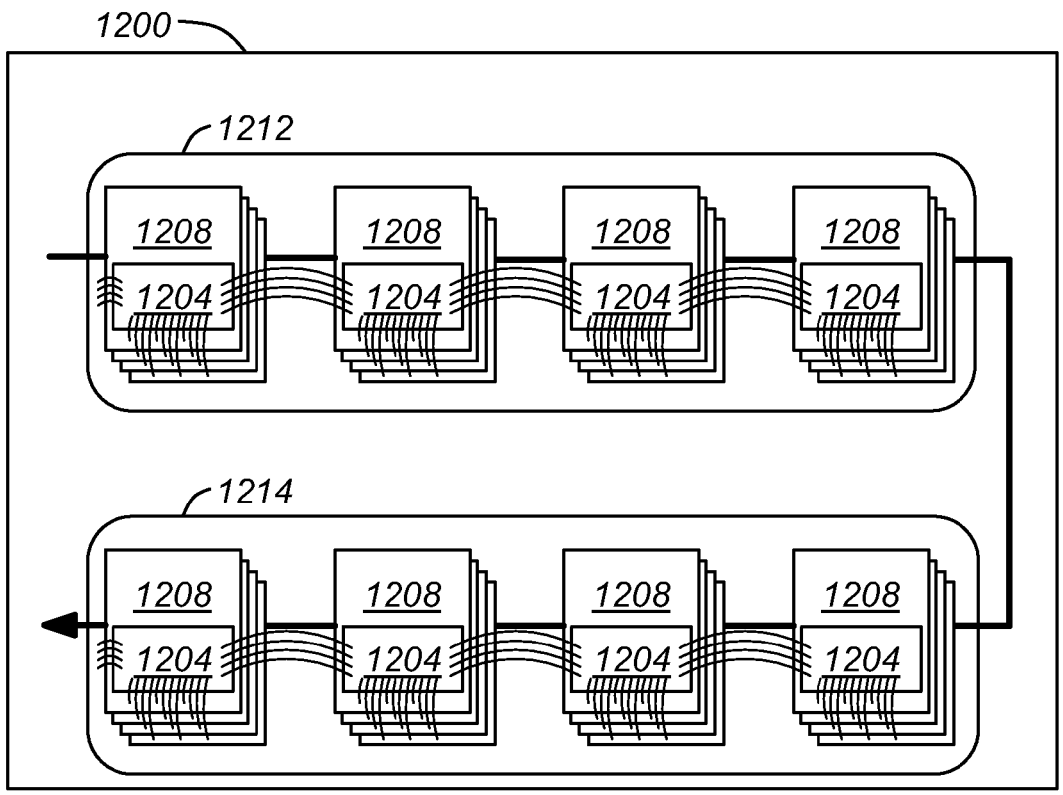
FIG. 19 is a diagram of a PCB area in accordance with another example embodiment, the illustrated area being, in some examples, a part of a larger area of a PCB for an SSD.

Referring now to FIG. 19, illustrated is a PCB area 1200 in accordance with another example embodiment. Within the PCB area 1200, there is a plurality of series-connected interface chips 1204, such that the illustrated system may be characterized as having a ring-type architecture. It should be noted that, in some examples, the illustrated PCB area 1200 can correspond to a flash chip area similar to any of those shown in dashed lines in any of FIGS. 5 through 9; however it will be understood that the presently described example embodiment is not limited to only PCBs that are employed in SSDs. In connection with data transmissions occurring within some examples of the illustrated system, data may be transmitted from one of the interface chips 1204 to a neighboring interface chip in a manner as described in U.S. patent application Ser. No. 12/033,577 entitled "SYSTEM HAVING ONE OR MORE MEMORY DEVICES". In alternative examples of the illustrated system, data transmission between different ring stages may be realized in some other suitable manner.

Still with reference to FIG. 19, each of the interface chips 1204 is electrically connected to each of a plurality (four in the illustrated example embodiment) of NAND flash chips 1208 in a stage. Also, each of the plurality of NAND flash chips 1208 in a stage are stacked one on top of each other, with the interface chip 1204 at the top of the stack. Eight stages are present in the illustrated ring (one stack per stage, each stack five chips in height). Also with respect to the illustrated example embodiment, a first group of four of the eight stacks are encapsulated within an encapsulation 1212, and a second group of four of the eight stacks are encapsulated within another encapsulation 1214. In connection with data transmissions occurring between chips belonging to the same ring stage (i.e. stack), data may be transmitted from any one of the NAND flash chips 1208 to the interface chip 1204 (or vice-versa) in the typical manner associated with asynchronous NAND. Alternatively, in other examples these data transmissions will occur in some other manner such as, for instance, synchronously as described in the ONFi 2.0 spec.

Figure 20:
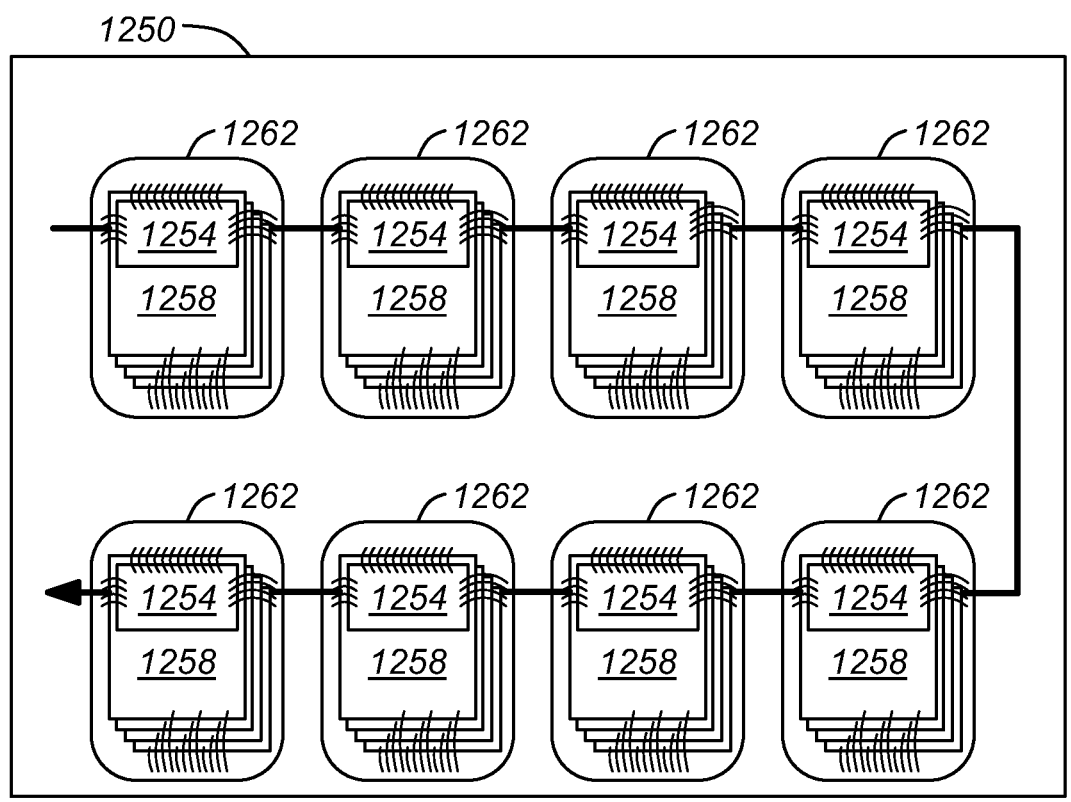
FIG. 20 is a diagram of a PCB area in accordance with another example embodiment, the illustrated area being, in some examples, a part of a larger area of a PCB for an SSD.

Referring now to FIG. 20, illustrated is a PCB area 1250 in accordance with another example embodiment. Within the PCB area 1250, there is a plurality of series-connected interface chips 1254, such that the illustrated system may be characterized as having a ring-type architecture. It should be noted that, in some examples, the illustrated PCB area 1250 can correspond to a flash chip area similar to any of those shown in dashed lines in any of FIGS. 5 through 9; however it will be understood that the presently described example embodiment is not limited to only PCBs that are employed in SSDs. In connection with data transmissions occurring within some examples of the illustrated system, data may be transmitted from one of the interface chips 1254 to a neighboring interface chip in a manner as described in U.S. patent application Ser. No. 12/033,577 entitled "SYSTEM HAVING ONE OR MORE MEMORY DEVICES". In alternative examples of the illustrated system, data transmission between different ring stages may be realized in some other suitable manner.

Still with reference to FIG. 20, each of the interface chips 1254 communicates with each of a plurality (four in the illustrated example embodiment) of NAND flash chips 1258 in a stage via electrical paths provided by the PCB. Also, each of the plurality of NAND flash chips 1258 in a stage are stacked one on top of each other, with the interface chip 1254 at the top of the stack. Eight stages are present in the illustrated ring (one stack/stage, each stack five chips in height). Each of the eight stacks is encapsulated within its own encapsulation 1262. In connection with data transmissions occurring between chips belonging to the same ring stage (i.e. stack), data may be transmitted from any one of the NAND flash chips 1258 to the interface chip 1254 (or vice-versa) in the typical manner associated with asynchronous NAND. Alternatively, in other examples these data transmissions will occur in some other manner such as, for instance, synchronously as described in the ONFi 2.0 spec.

Although the example embodiments of FIGS. 16 through 20 have been described in terms of the memory chips being of a uniform type, mixed types of a memory chips within a memory system is contemplated. For example, in connection with the example embodiments of FIGS. 16 through 20, the memory chip(s) in a first stage might include a NAND flash chip, whereas the memory chip(s) in a subsequent stage might include a DRAM chip. In connection with the example embodiments of FIGS. 18 through 20, mixed types of a memory chips within an individual stage is contemplated.

Although in FIGS. 18 through 20 the illustrated stacks are five chips in height, it will be understood that in alternative example embodiments this number will vary, and in fact stacks formed of any suitable number of chip are contemplated. For conventional packaging, stacking beyond four chips may be difficult because heat and stress become big issues. By contrast, for example embodiments herein that are characterized by COB technology, stacking even in excess of ten chips is contemplated. Those skilled in the art will appreciate that such large chip number stacking is achievable by making the dies ultra thin. In this regard, typically during semiconductor manufacturing the backside of the wafer is grinded down to bring the thickness within the range of, for example, 300-100 μm. However in connection with the production of ultra thin dies, the backside of the wafer is grinded down even further such as, for example, down to the range of 100-50 μm. Thus in connection with ultra thin dies, large chip number stacking is possible, as compared to less thin dies and having regard to heat and stress issues.

Still with reference to FIGS. 18 through 20, it will be seen that there is a staggering of the NAND flash chips to leave chip edges exposed to facilitate wiring, and it will be understood that various example embodiments are characterized by this and other inventive features disclosed in commonly owned U.S. patent application Ser. No. 12/168,354 entitled "DATA STORAGE AND STACKABLE CONFIGURATIONS", the entire contents of which are herein incorporated by reference.

Also, it will be understood that various alternative COB example embodiments are characterized by stacked chips that are interconnected in accordance with Through-Silicon Via (TSV) as disclosed in the above-mentioned patent application and also commonly owned U.S. patent application Ser. No. 12/236,874 entitled "METHOD FOR STACKING SERIALLY-CONNECTED INTEGRATED CIRCUITS AND MULTI-CHIP DEVICE MADE FROM SAME", the entire contents of which are herein incorporated by reference. As will be appreciated by those skilled in the art, the short interconnect of through hole vias can be expected to provide less inductance, capacitance, and resistance so that signal integrity of the encapsulated stack of chips may be better than if bonding wire had been used. In some instances, the capacitive effect of each lead on a package can easily be as big as three to four picofarads, so TSV implementations may be desirable because it removes any issues associated with these capacitive effects.

Continuing on, various illustrated COB example embodiments are characterized by stacking with edge wire bonding. Although not illustrated, alternative COB example embodiments are characterized by stacking with center wire bonding.

In some examples, the interface chips shown in connection with any of the example embodiments of FIGS. 13 through 20 may operate as described in commonly owned U.S. Provisional Patent Application Ser. No. 61/111,013 entitled "SYSTEM HAVING ONE OR MORE NONVOLATILE MEMORY DEVICES", the entire contents of which are herein incorporated by reference. For instance, as described in the above-referenced application, each memory chip that communicates with an interface chip via a lower performance interface may be effectively addressed by the interface chip as a bank, with a data channel for each bank so that the number of channels between the interface chip and the banks equals the number of banks. Also, to reduce potential latency (overhead) in delivery of read data from the conventional memory chips, one or more of the interface chips may include embedded memory such as, for example, Static Random Access Memory (SRAM) that is configured to store data. With respect to an implementation of a system including flash devices and an interface chip with SRAM, data may be transferred from the physical page buffer within the one of the convention flash devices to the interface chip before initiation of the burst data read on the higher performance (i.e. series-connection configuration) interface. Also, overhead in conjunction with flash operations can be further managed by having data size transfers to the SRAM of sizes less than an entire page. In this manner data transfer time associated with a read operation within the system is not bottlenecked by the time for a full page transfer. In some examples, the data width of the lower performance interface may be greater than the data width of the higher performance interface. For instance, if the data width of the lower performance interface is, for example, x16, x32 or x64, then the data width of the higher performance interface may be, for example, x4 or x8.

While the PCBs shown in FIGS. 5 through 12 are illustrated with respect to one side of the PCB, example embodiments are not limited to PCB with chips on only one side of the PCB. Some example embodiments are characterized by additional chips on the other side of the PCB that may be similarly encapsulated as has been described. Also, although in each of FIGS. 5 through 12 the SSD controller is shown attached to the PCB, alternatively the SSD controller may be separate from the PCB.

A number of example embodiments can be applied to any suitable solid state memory systems such as, for example, those that include NAND Flash EEPROM device(s), NOR Flash EEPROM device(s), AND Flash EEPROM device(s), DiNOR Flash EEPROM device(s), Serial Flash EEPROM device(s), DRAM device(s), SRAM device(s), Ferro RAM device(s), Magneto RAM device(s), Phase Change RAM device(s), or any suitable combination of these devices.

Certain adaptations and modifications of the described embodiments can be made. Therefore, the above discussed embodiments are considered to be illustrative and not restrictive. Also, in some instances in which circuit schematics have been presented and described herein, certain details not sufficiently relevant to an understanding of example embodiments may have been omitted so as not to obscure inventive features disclosed herein.

What is claimed is:

1. A solid state drive comprising:
a circuit board having opposing first and second surfaces;
a plurality of semiconductor chips attached to the first surface, the plurality of semiconductor chips including at least one memory chip and at least one stack of memory chips that are at least substantially glob top encapsulated, the at least one stack of memory chips including first, second and third stacks of memory chips, the first stack of memory chips including first and second memory chips and a third chip different from the first and second memory chips of the first stack of memory chips, the second stack of memory chips including first and second memory chips and a third chip different from the first and second memory chips of the second stack of memory chips, the third stack of memory chips including first and second memory chips and a third chip different from the first and second memory chips of the third stack of memory chips, the third chip of the first stack of memory chips being series-connected with the third chip of the second stack of memory chips, which is in turn further series-connected with the third chip of the third stack of memory chips;
an interface connector within the solid state drive, the interface connector configured for connection to an end of a cable; and
a controller in communication with at least a number of the plurality of semiconductor chips during operation, the number of semiconductor chips including the at least one memory chip, and the controller including an interface to receive, from a computer system via the interface connector, signals for processing within the solid state drive.

2. The solid state drive as claimed in claim 1 wherein the third chip in each of the first, second and third stacks of memory chips is configured for asynchronous communication with respective first and second memory chips of a respective one of the first, second and third stacks of memory chips.

3. The solid state drive as claimed in claim 1 wherein the third chip in each of the first, second and third stacks of memory chips is configured for synchronous communication with respective first and second memory chips of a respective one of the first, second and third stacks of memory chips.

4. A solid state drive comprising:
a circuit board having opposing first and second surfaces;
a plurality of semiconductor chips attached to the first surface, the plurality of semiconductor chips including at least one memory chip and at least one stack of memory chips that are at least substantially glob top encapsulated, the at least one stack of memory chips including first, second and third stacks of memory chips, the first stack of memory chips including first and second memory chips and a third chip different from the first and second memory chips of the first stack of memory chips, the second stack of memory chips including first and second memory chips and a third chip different from the first and second memory chips of the second stack of memory chips, the third stack of memory chips including first and second memory chips and a third chip different from the first and second memory chips of the third stack of memory chips, the third chip in each of the first, second and third stacks of memory chips is being configured for asynchronous communication with respective first and second memory chips of a respective one of the first, second and third stacks of memory chips;
an interface connector within the solid state drive, the interface connector configured for connection to an end of a cable; and
a controller in communication with at least a number of the plurality of semiconductor chips during operation, the number of semiconductor chips including the at least one memory chip, and the controller including an interface to receive, from a computer system via the interface connector, signals for processing within the solid state drive.

5. The solid state drive as claimed in claim 4 wherein each of the first, second and third stacks of memory chips includes a respective multi-drop bus for the respective asynchronous communication.

6. The solid state drive as claimed in claim 5 wherein the third chip in each of the first, second and third stacks of memory chips includes a respective embedded memory for storing read data provided via the respective multi-drop bus from one or more memory chips in the respective stack of memory chips.

7. The solid state drive as claimed in claim 6 wherein the embedded memory in the third chip of each of the first, second and third stacks of memory chips is Static Random Access Memory.

8. A solid state drive comprising:
a circuit board having opposing first and second surfaces;
a plurality of semiconductor chips attached to the first surface, the plurality of semiconductor chips including at least one memory chip and at least one stack of memory chips that are at least substantially glob top encapsulated, the at least one stack of memory chips including first, second and third stacks of memory chips, the first stack of memory chips including first and second memory chips and a third chip different from the first and second memory chips of the first stack of memory chips, the second stack of memory chips including first and second memory chips and a third chip different from the first and second memory chips of the second stack of memory chips, the third stack of memory chips including first and second memory chips and a third chip different from the first and second memory chips of the third stack of memory chips, the third chip in each of the first, second and third stacks of memory chips is being configured for synchronous communication with respective first and second memory chips of a respective one of the first, second and third stacks of memory chips;
an interface connector within the solid state drive, the interface connector configured for connection to an end of a cable; and
a controller in communication with at least a number of the plurality of semiconductor chips during operation, the number of semiconductor chips including the at least one memory chip, and the controller including an interface to receive, from a computer system via the interface connector, signals for processing within the solid state drive.

9. The solid state drive as claimed in claim 8 wherein each of the first, second and third stacks of memory chips includes a respective multi-drop bus for the respective synchronous communication.

10. The solid state drive as claimed in claim 9 wherein the third chip in each of the first, second and third stacks of memory chips includes a respective embedded memory for storing read data provided via the respective multi-drop bus from one or more memory chips in the respective stack of memory chips.

11. The solid state drive as claimed in claim 10 wherein the embedded memory in the third chip of each of the first, second and third stacks of memory chips is Static Random Access Memory.

* * * * *